United States Patent
Okaniwa et al.

(10) Patent No.: US 11,935,803 B2
(45) Date of Patent: Mar. 19, 2024

(54) RESIN COMPOSITION, LAMINATE, SEMICONDUCTOR WAFER WITH RESIN COMPOSITION LAYER, SUBSTRATE FOR MOUNTING SEMICONDUCTOR WITH RESIN COMPOSITION LAYER AND SEMICONDUCTOR DEVICE

(71) Applicant: MITSUBISHI GAS CHEMICAL COMPANY, INC., Tokyo (JP)

(72) Inventors: Masashi Okaniwa, Tokyo (JP); Takenori Takiguchi, Tokyo (JP); Kohei Higashiguchi, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 774 days.

(21) Appl. No.: 17/049,456

(22) PCT Filed: Apr. 24, 2019

(86) PCT No.: PCT/JP2019/017363
§ 371 (c)(1),
(2) Date: Oct. 21, 2020

(87) PCT Pub. No.: WO2019/208614
PCT Pub. Date: Oct. 31, 2019

(65) Prior Publication Data
US 2021/0277221 A1   Sep. 9, 2021

(30) Foreign Application Priority Data

Apr. 26, 2018   (JP) ................................ 2018-085651

(51) Int. Cl.
*C08F 283/00*   (2006.01)
*C08L 51/08*   (2006.01)
*H01L 23/29*   (2006.01)

(52) U.S. Cl.
CPC .......... *H01L 23/293* (2013.01); *C08F 283/00* (2013.01); *C08L 51/08* (2013.01); *H01L 23/295* (2013.01)

(58) Field of Classification Search
CPC ............................... C08L 51/08; C08F 283/00
USPC ........................................................ 524/89
See application file for complete search history.

(56) References Cited

U.S. PATENT DOCUMENTS

| | | |
|---|---|---|
| 5,258,426 A | 11/1993 | Uchida et al. |
| 2003/0111519 A1 | 6/2003 | Kinney et al. |
| 2009/0001315 A1 | 1/2009 | Ishikawa |
| 2010/0143630 A1 | 6/2010 | Gong et al. |
| 2015/0056557 A1* | 2/2015 | Irie ........................ G03F 7/027 |
| | | 430/326 |
| 2016/0312070 A1 | 10/2016 | Huang |
| 2016/0369148 A1* | 12/2016 | Nishio ..................... C09D 7/61 |
| 2017/0058102 A1 | 3/2017 | Kushihara et al. |
| 2019/0033714 A1* | 1/2019 | Baba .................. C08G 73/1042 |
| 2019/0139806 A1* | 5/2019 | Hayashishita .......... B32B 27/00 |
| 2019/0300678 A1 | 10/2019 | Takiguchi et al. |

FOREIGN PATENT DOCUMENTS

| | | |
|---|---|---|
| JP | 2-222441 A | 9/1990 |
| JP | 5-331354 A | 12/1993 |
| JP | 07-179570 A | 7/1995 |
| JP | 2003-86627 A | 3/2003 |
| JP | 2008-133423 A | 6/2008 |
| JP | 2008-543060 A | 11/2008 |
| JP | 2008-305900 A | 12/2008 |
| JP | 2011-52109 A | 3/2011 |
| JP | 2013-112730 A | 6/2013 |
| JP | 2015-503220 A | 1/2015 |
| JP | 2015-172145 A | 10/2015 |
| JP | 2016-27174 A | 2/2016 |
| JP | 2017-503057 A | 1/2017 |
| TW | 201718691 A | 6/2017 |
| WO | 2009/081874 A1 | 7/2009 |
| WO | 2009/090737 A1 | 7/2009 |
| WO | 2013/066597 A1 | 5/2013 |
| WO | WO-2017169009 A1 * | 10/2017 ......... C08G 73/1039 |
| WO | WO-2017170450 A1 * | 10/2017 ............ B32B 27/00 |
| WO | 2017/209043 A | 12/2017 |

OTHER PUBLICATIONS

International Search Report issued in International Patent Application No. PCT/JP2019/017363, dated Jul. 9, 2019, and English Translation thereof.

* cited by examiner

*Primary Examiner* — Deve V Hall
(74) *Attorney, Agent, or Firm* — GREENBLUM & BERNSTEIN, P.L.C.

(57) ABSTRACT

A resin composition that has excellent flux activity, flexibility and storage stability and that is suitable for a pre-applied underfill material is provided. The resin composition contains a compound (A) having a phenolic hydroxy group, a metal ion trapping agent (B) and a radical polymerizable compound (C).

27 Claims, No Drawings

RESIN COMPOSITION, LAMINATE, SEMICONDUCTOR WAFER WITH RESIN COMPOSITION LAYER, SUBSTRATE FOR MOUNTING SEMICONDUCTOR WITH RESIN COMPOSITION LAYER AND SEMICONDUCTOR DEVICE

TECHNICAL FIELD

The present invention relates to a resin composition, a laminate using the resin composition, a semiconductor wafer with a resin composition layer, a substrate for mounting a semiconductor with a resin composition layer and a semiconductor device. In more detail, the present invention relates to a resin composition that is useful as an underfill material.

BACKGROUND ART

In recent years, in association with the downsizing and performance improvement of semiconductor devices, flip chip bonding is getting a lot of attention as a method for mounting a semiconductor chip (hereinafter, may be abbreviated as "chip") on a substrate for mounting a semiconductor (hereinafter, may be abbreviated as the "substrate"). In the flip chip bonding, a construction method is common in which, after joining the chip and the substrate, the gap between the chip and the substrate is filled with an underfill material, which is then cured. However, due to the downsizing and performance improvement of semiconductor devices, the electrode pitch arranged on the chip has become narrower and the gap between the electrodes has also become narrower. As a result, there have been problems that operability is worsened due to a longer time for filling the underfill material, and that filling failures occur, such as unfilling. In response to this, a construction method has been examined in which, after supplying a pre-applied underfill material to the chip or substrate, the joint of the chip and the substrate and the filling of the underfill material are carried out at the same time.

When the joint between a chip and a substrate is carried out via a metal that is easily oxidized, such as solder or copper, a flux component derived from a carboxylic acid or the like may be added to a pre-applied underfill material for the purpose of removing a oxidized layer, which is an inhibiting factor for the joint, and obtaining good metal joint.

Patent Document 1 describes a pre-applied underfill material that uses an epoxy compound. In addition, Patent Document 2 also describes a pre-applied underfill material that uses an epoxy compound.

Patent Document 3 describes a pre-applied underfill material that uses an epoxy compound and a flux component. In addition, Patent Document 4 describes an underfill material that uses an acrylic monomer. Then, Patent Document 5 describes a pre-applied underfill material that uses a radical polymerizable monomer.

Patent Document 6 describes a film-like adhesive that contains a copper ion adsorbing layer containing a resin having a skeleton that can form a complex with copper ions, wherein the resin having a skeleton that can form a complex with copper ions is a phenolic resin having a triazine skeleton.

CITATION LIST

Patent Document

Patent Document 1: Japanese Patent Application Laid-Open No. 2008-133423

Patent Document 2: Japanese Patent Application Laid-Open No. 2016-027174
Patent Document 3: Japanese Patent Application Laid-Open No. 2013-112730
Patent Document 4: Japanese Patent Application Laid-Open No. 2015-172145
Patent Document 5: Japanese Translation of PCT International Application Publication No. 2015-503220
Patent Document 6: Japanese Patent Application Laid-Open No. 2011-52109

SUMMARY OF INVENTION

Technical Problem

In the case of pre-applied underfill materials that use epoxy compounds as described in Patent Documents 1 and 2, there are advantages in epoxy compounds that they have high adhesiveness to a variety of materials and have excellent electrical insulation properties. However, such pre-applied underfill materials are intentionally free of flux components. Therefore, it is difficult to remove the oxidized layer with the pre-applied underfill materials described in Patent Documents 1 and 2.

Meanwhile, in Patent Document 3, a particular carboxyl group containing compound is used as the flux component. However, reaction between the carboxyl group containing compound and an epoxy compound progresses slightly even at room temperature, and the flux activity is reduced over time during storage. Therefore, it has disadvantages, such as unstable joint formation and poor mass productivity.

In Patent Document 4 as well, a flux component is not contained intentionally, and therefore, it is not possible to remove the oxidized layer before metal joint.

In Patent Document 5, a thermal radical initiator is used as a polymerization initiator for a radical polymerizable monomer. However, in Patent Document 5, a polymer containing a carboxyl group is used, but due to its large molecular weight, the mobility of the carboxyl group is low and a sufficient flux activity cannot be expected.

Also, as copper has a characteristic of being prone to corrosion, copper ions generated by corrosion permeate into a semiconductor chip and act on transistors, thereby causing malfunction, and there is a tendency that short circuits due to migration between the electrodes of the chips are caused. Therefore, in Patent Document 6, there is description about a film-like adhesive that contains a phenolic resin having a triazine skeleton, which is a skeleton that can form a complex with copper ions. However, this adhesive has problems that the mobility is low because the phenolic component having a triazine skeleton is incorporated into the resin skeleton and that the oxidized layer is extremely hardly removed.

The present invention has been made in view of such problems, and an object of the present invention is to provide a resin composition that has excellent flux activity, flexibility and storage stability and that is suitable for an underfill material, a laminate, a semiconductor wafer with a resin composition layer, a substrate for mounting a semiconductor with a resin composition layer and a semiconductor device.

Solution to Problem

The present inventors have, as a result of devoted examinations to solve the above problems, found out that a resin composition comprising a compound (A) having a phenolic hydroxy group, a metal ion trapping agent (B) and a radical polymerizable compound (C) can solve the above problems, and reached the present invention.

More specifically, the present invention includes the following contents.

[1] A resin composition comprising: a compound (A) having a phenolic hydroxy group; a metal ion trapping agent (B); and a radical polymerizable compound (C).

[2] The resin composition according to [1], wherein the compound (A) having the phenolic hydroxy group has a molecular weight of 200 or more and a melting point of 300° C. or lower.

[3] The resin composition according to [1] or [2], wherein the compound (A) having the phenolic hydroxy group has a 5% mass reduction temperature of 250° C. or higher.

[4] The resin composition according to any of [1] to [3], wherein the metal ion trapping agent (B) comprises at least one element selected from nitrogen and oxygen as a coordinating atom.

[5] The resin composition according to any one of [1] to [4], wherein the metal ion trapping agent (B) comprises at least one selected from the group consisting of an amine, an amine derivative, an ether derivative and a ketone derivative.

[6] The resin composition according to any one of [1] to [5], wherein the metal ion trapping agent (B) comprises at least one selected from the group consisting of a triazine derivative, a bipyridine derivative and a diketone derivative.

[7] The resin composition according to any one of [1] to [6], wherein the metal ion trapping agent (B) comprises a 1,3-diketone.

[8] The resin composition according to any of [1] to [6], wherein the metal ion trapping agent (B) comprises at least one selected from the group consisting of 2,4-diamino-6-methyl-1,3,5-triazine, 2,2'-bipyridine, 1,3-diphenyl-1,3-propanedione, 1-(2-mesitylene)-1,3-butanedione, 1,3-bis(4-methoxyphenyl)-1,3-propanedione, 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione.

[9] The resin composition according to any one of [1] to [8], wherein the metal ion trapping agent (B) comprises at least one selected from the group consisting of 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione.

[10] The resin composition according to any one of [1] to [9], wherein the radical polymerizable compound (C) comprises at least one selected from the group consisting of a (meth)acrylate compound, a maleimide compound and a propenyl compound.

[11] The resin composition according to [10], wherein the radical polymerizable compound (C) comprises at least one selected from the group consisting of 2,2'-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2) and a maleimide compound represented by the following formula (3):

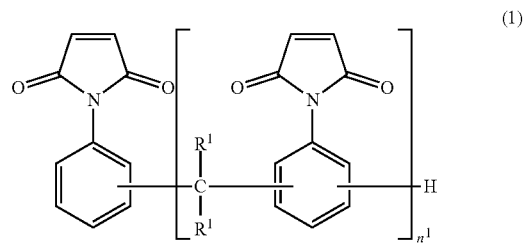

wherein each $R^1$ independently represents a hydrogen atom or a methyl group, and $n^1$ represents an integer of 1 or more;

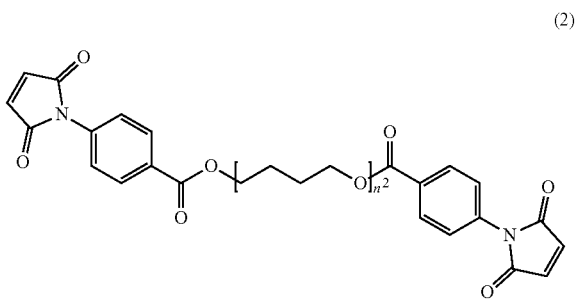

wherein an average value of $n^2$ is 1 or more and 30 or less; and

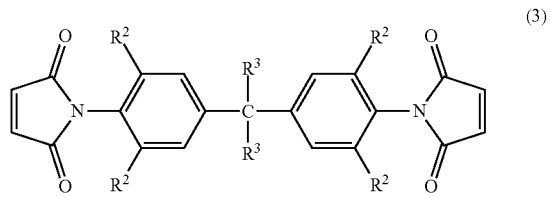

wherein each $R^2$ independently represents a hydrogen atom, a methyl group or an ethyl group, and each $R^3$ independently represents a hydrogen atom or a methyl group.

[12] The resin composition according to [11], wherein the radical polymerizable compound (C) comprises at least one maleimide compound selected from the group consisting of 2,2'-bis(4-(4-maleimidophenoxy)phenyl)propane, the maleimide compound represented by the above formula (1), the maleimide compound represented by the above formula (2) and the maleimide compound represented by the above formula (3).

[13] The resin composition according to any of [1] to [12], wherein a content of the compound (A) having the phenolic hydroxy group in the resin composition is 5 parts by mass or more and 50 parts by mass or less based on 100 parts by mass of a total amount of the radical polymerizable compound (C) in the resin composition.

[14] The resin composition according to any of [1] to [13], wherein a content of the metal ion trapping agent (B) in the resin composition is 5 parts by mass or more and 50 parts by mass or less based on 100 parts by mass of a total amount of the radical polymerizable compound (C) in the resin composition.

[15] The resin composition according to any of [1] to [14], further comprising an inorganic filler (D).

[16] The resin composition according to [15], wherein the inorganic filler (D) has an electrical insulation property.

[17] The resin composition according to [15] or [16], wherein the inorganic filler (D) has an average particle diameter of 3 μm or less.

[18] The resin composition according to any of [15] to [17], wherein the inorganic filler (D) comprises at least one selected from the group consisting of silica, aluminum hydroxide, alumina, boehmite, boron nitride, aluminum nitride, magnesium oxide and magnesium hydroxide.

[19] The resin composition according to any of [15] to [18], wherein a content of the inorganic filler (D) in the resin composition is 300 parts by mass or less based on 100 parts by mass of a total amount of the radical polymerizable compound (C).

[20] The resin composition according to any of [1] to [19], further comprising a flexibility imparting component (E).

[21] The resin composition according to [20], wherein the flexibility imparting component (E) comprises a thermoplastic polymer compound and the polymer compound has a mass average molecular weight of 1,000 or more and 1,000,000 or less.

[22] The resin composition according to [20] or [21], wherein the flexibility imparting component (E) comprises at least one selected from the group consisting of a (meth) acrylic oligomer and a (meth)acrylic polymer.

[23] The resin composition according to any of [1] to [22], for use in a pre-applied underfill material.

[24] A laminate comprising: a supporting material; and a layer comprising the resin composition according to any of [1] to [23] laminated on the supporting material.

[25] A semiconductor wafer with a resin composition layer, comprising: a semiconductor wafer; and the laminate according to [24] laminated on the semiconductor wafer, wherein the layer comprising the resin composition is laminated on the semiconductor wafer.

[26] A substrate for mounting a semiconductor with a resin composition layer, comprising: a substrate for mounting a semiconductor; and the laminate according to [24] laminated on the substrate for mounting a semiconductor, wherein the layer comprising the resin composition is laminated on the substrate for mounting a semiconductor.

[27] A semiconductor device, comprising the semiconductor wafer with a resin composition layer according to [25]; and/or the substrate for mounting a semiconductor with a resin composition layer according to [26].

Advantageous Effects of Invention

According to the present invention, a resin composition that has excellent flux activity, flexibility and storage stability and that is suitable for an underfill material, a laminate, a semiconductor wafer with a resin composition layer, a substrate for mounting a semiconductor with a resin composition layer and a semiconductor device can be provided.

DESCRIPTION OF EMBODIMENTS

Hereinafter, an embodiment for performing the present invention (hereinafter, simply referred to as the "present embodiment") will be described in detail. Note that the present embodiment below is given in order to illustrate the present invention, and the present invention is not limited only to the present embodiment.

As used herein, "(meth)acrylo" means both "acrylo" and "methacrylo" corresponding to that. "(Meth)acryl" means both "acryl" and "methacryl" corresponding to that. "(Meth) acrylate" means both "acrylate" and "methacrylate" corresponding to that.

A resin composition according to one aspect of the present embodiment contains a compound (A) having a phenolic hydroxy group, a metal ion trapping agent (B) and a radical polymerizable compound (C). The resin composition of the present embodiment is preferable for applications of an underfill material, and is used more preferably for applications of a pre-applied underfill material.

A resin composition according to another aspect of the present embodiment further contains an inorganic filler (D) in addition to the components described above.

A resin composition according to another aspect of the present embodiment further contains a flexibility imparting component (E) in addition to the components described above.

In another aspect of the present embodiment, a laminate obtained by using the resin composition according to the present embodiment (hereinafter, also referred to as the "resin laminate"), a semiconductor wafer with a resin composition layer fabricated by using the laminate, a substrate for mounting a semiconductor with a resin composition layer fabricated by using the laminate, and a semiconductor device fabricated by using the resin composition of the present embodiment are also provided.

[I. Resin Composition]

The resin composition of the present embodiment is suitably a resin composition that is used as an underfill material to be used for the flip chip bonding. This resin composition contains a compound (A) having a phenolic hydroxy group, a metal ion trapping agent (B) and a radical polymerizable compound (C). The resin composition of the present embodiment may further contain an inorganic filler (D) and/or a flexibility imparting component (E).

[I-1. Compound (A) Having Phenolic Hydroxy Group]

The compound (A) having the phenolic hydroxy group is a component that mainly contributes to the flux activity of the resin composition.

The compound (A) having the phenolic hydroxy group is not particularly limited as long as it is a compound having one or more phenolic hydroxy groups in the molecule. The compound (A) may be a phenolic resin.

For the compound (A) having the phenolic hydroxy group, it is preferable to prevent the compound (A) having the phenolic hydroxy group from being volatilized before the flux activity is expressed during the flip chip bonding, that is, from being volatilized before the oxidized layer at the joint is removed. From such a viewpoint, although the molecular weight of the compound (A) having the phenolic hydroxy group is not particularly limited as long as the effect of the present embodiment is achieved, it is preferably 200 or more, more preferably 250 or more from the viewpoint of reducing volatile portions upon thermal curing, and still more preferably 300 or more from the viewpoint of reducing volatile portions in the flip chip bonding. On the other hand, from the viewpoint of having mobility as an acid and obtaining more sufficient flux activity, the molecular weight of the compound (A) having the phenolic hydroxy group is preferably 10,000 or less, more preferably 8,000 or less from the viewpoint of solvent solubility, and still more preferably 6,000 or less from the viewpoint of ensuring mobility for efficiently reaching the oxidized layer at the joint in the flip chip bonding.

Note that, in the present embodiment, the molecular weight, if the object is a compound, represents the molecular weight of that compound, and if the object is a resin, represents the mass average molecular weight (Mw). The mass average molecular weight can be determined by the GPC (gel permeation chromatogram) method using polystyrene as the standard substance.

Although the melting point of the compound (A) having the phenolic hydroxy group is not particularly limited as long as the effect of the present embodiment is achieved, it is preferably 300° C. or lower, more preferably 0 to 260° C. from the viewpoint of being melted at or below the melting point of general solder and acting on the oxidized layer, and still more preferably 40 to 240° C. from the viewpoint of ensuring the storage stability at room temperature while it is necessary to be melted at or below the melting point of solder used for the joint upon the flip chip bonding.

Although the 5% mass reduction temperature of the compound (A) having the phenolic hydroxy group is not particularly limited as long as the effect of the present embodiment is achieved, it is preferably 250° C. or higher, more preferably 260° C. or higher from the viewpoint of suppressing volatile portions upon heating in the semiconductor device producing process, and still more preferably 270° C. or higher from the viewpoint of suppressing volatile portions upon the flip chip bonding. If the 5% mass reduction temperature is lower than 250° C., a large amount of volatile portions will be generated during the flip chip bonding, and this may cause voids in the cured product and process contamination.

The 5% mass reduction temperature of the compound (A) having the phenolic hydroxy group can be determined by using thermal gravimetric analysis (TGA). The measurement method will be explained specifically. A predetermined amount of the compound is prepared for TGA and the temperature is elevated from room temperature to 500° C. at 10° C./min. The temperature at which the mass is decreased by 5% is defined from the obtained mass reduction curve as the 5% mass reduction temperature.

Examples of the compound (A) having the phenolic hydroxy group include, for example, 9,9'-bis-(4-hydroxy-3-methylphenyl)fluorene, biscresolfluorene, bisphenolfluorene, 2,4,6-tris(3,5-di-tert-butyl-4-hydroxybenzyl)mesitylene, hesperidin, α,α',α"-tris(4-hydroxyphenyl)-1-ethyl-4-isopropylbenzene, α,α'-bis(4-hydroxy-3,5-dimethylphenyl)-1,4-diisopropylbenzene, 4,4'-methylenebis(2,6-di-tert-butylphenol), 1,1',3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, 2,3,4-trihydroxybenzophenone, 2,3,4,4'-tetrahydroxybenzophenone, 2-bis(4-hydroxyphenyl)propane, tris(4-hydroxyphenyl)methane, 1,1',1"-tris(4-hydroxy-3-methylphenyl)ethane, 1,1',2,2'-tetrakis(4-hydroxyphenyl)ethane, 4,4'-butylidenebis(6-tert-butyl-m-cresol) and pentaerythritol tetrakis[3-(3,5-di-tert-butyl-4-hydroxyphenyl)propionate].

Also, examples of the phenolic resin, which is the compound (A) having the phenolic hydroxy group, include, for example, a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene skeleton-modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus containing phenolic resin, a hydroxy group containing silicone resin, a propenyl phenolic resin, an allyl phenolic resin and a propenyl biphenylene resin.

For the compound (A) having the phenolic hydroxy group, those commercially available may be used, and examples thereof include, for example, PHENOLITE (registered trademark) KA-1163 manufactured by DIC CORPORATION; IBIS (registered trademark)-MP manufactured by Taoka Chemical Co., Ltd.; SN-495V manufactured by the new Nippon Steel Chemical Co., Ltd.; LVA01 manufactured by Gun Ei Chemical Industry Co., Ltd.; BPN01 manufactured by Gun Ei Chemical Industry Co., Ltd.; TPMP01 manufactured by Gun Ei Chemical Industry Co., Ltd.; PPN-80 manufactured by Gun Ei Chemical Industry Co., Ltd.; ELPC75 manufactured by Gun Ei Chemical Industry Co., Ltd.; GP-100 manufactured by Fudow Co., Ltd.; and GPH103 manufactured by Nippon Kayaku Co., Ltd.

Among these compounds (A) with a phenolic hydroxy group, 9,9'-bis-(4-(hydroxy-3-methylphenyl))fluorene, a cresol novolac-based phenolic resin, a naphthol aralkyl-based phenolic resin, a propenyl phenolic resin, a propenyl biphenylene resin and an allyl phenolic resin are preferable from the viewpoint of suppressing volatile portions and the mobility of the molecule in a semiconductor device in which the resin composition of the present embodiment is used as an underfill material, preferably as a pre-applied underfill material. These compounds (A) having a phenolic hydroxy group can be used alone as one kind or can be used in combination of two or more kinds.

Although the content of the compound (A) having the phenolic hydroxy group in the resin composition is not particularly limited as long as the effect of the present embodiment is achieved, it is preferably 5 parts by mass or more and 50 parts by mass or less based on 100 parts by mass of the total amount of a radical polymerizable compound (C), which will be described below, in the resin composition, more preferably 10 parts by mass or more and 45 parts by mass or less from the viewpoint of ensuring sufficient flux activity and solvent solubility, and still more preferably 15 parts by mass or more and 40 parts by mass or less from the viewpoint of ensuring sufficient flux activity and solvent solubility, and sufficient flexibility of the resin composition.

[I-2. Metal Ion Trapping Agent (B)]

The metal ion trapping agent (B) is not particularly limited as long as it is a compound that can trap a metal ion. The metal ion to be trapped is not particularly limited, but is preferably a copper ion.

When a relatively strong acid, such as a carboxyl group containing compound, is used as a flux component in an underfill material, even after curing, it still retains an action of corroding the electrode portion, the chip or the copper wiring of substrate, which thus proposes a problem of causing a chip malfunction or insulation failure. With respect to this problem, the present inventors have presumed that the acid corrodes a metal such as copper, and the ionized metal moves via the cured product between the connection terminals and is deposited to cause a short circuit between the terminals, so called migration, thereby bringing about insulation failure. Then, the present inventors have conducted devoted examinations to remove the oxidized layer by using a compound having a phenolic hydroxy group, which has acidity weaker than that of a carboxyl group containing compound, as a flux component. When the phenol alone is used as the flux component, if the phenol has a large acid dissociation constant, the proton concentration acting on the oxidized layer is low and therefore the concentration of metal ions dissolved and produced from the oxidized layer remains small, and removal of the oxidized layer is not carried out sufficiently. On the other hand, the present inventors have found that, when a metal ion trapping agent is added to this reaction field to remove metal ions from the reaction field, production of metal ions, that is, decomposition of the oxidized layer is accelerated due to a function of keeping equilibrium of the system, and as a result, the amount of the oxidized layer to be removed is increased and the oxidized layer can be removed.

Although the metal ion trapping agent (B) is not particularly limited as long as the effect of the present embodiment is achieved, it preferably contains at least one element selected from nitrogen and oxygen as the coordinating atom because it can suitably trap metal ions, in particular, copper ions. The metal ion trapping agent containing nitrogen as the coordinating atom is not particularly limited, and examples thereof include, for example, an amine and an amine derivative. The metal ion trapping agent containing oxygen as the coordinating atom is not particularly limited, and examples thereof include, for example, an ether derivative and a ketone derivative.

Examples of the amine derivative include, for example, an imidazole derivative, a triazole derivative, a pyrazole derivative, a triazine derivative, a pyridine derivative, a terpyridine derivative, a bipyridine derivative, a phenanthroline derivative, a pyrimidine derivative, a pyrazine derivative, a pyridazine derivative, a quinazoline derivative, a porphyrin derivative, a phthalocyanine derivative and a cyclen derivative. Examples of the ether derivative include, for example, a crown ether derivative. Examples of the ketone derivative include, for example, a diketone derivative.

Examples of the amine include, for example, 1,3-phenylenediamine, 2,6-diaminotoluene, 1,3-diaminopyrene, 2,4-diaminotoluene, 2,4,6-trimethyl-1,3-phenylenediamine, 2,4-diaminodiphenylamine, 3-acetamidoaniline, 1,2-diamino-4-nitrobenzene, 4-nitro-1,3-phenylenediamine, 2-methyl-5-nitroaniline, 3,5-diaminobenzoic acid, 2-amino-1-methylamino-4-nitrobenzene, 3-acetamido-4-methylaniline, N-(tert-butoxycarbonyl)-1,3-phenylenediamine, 3'-amino-4'-methoxyacetanilide and 3-(4-methyl-1-piperazinyl)aniline.

Examples of the imidazole derivative include, for example, imidazole, N-acetylimidazole, 1-(α,4-diphenylbenzyl)imidazole, 2,2'-(2,6-pyridinediyl)bis(benzimidazole), 4-(4,5-diphenyl-1H-imidazol-2-yl)benzoic acid, 2-(4-hydroxyphenyl)-4,5-diphenylimidazole, 5-chloro-1-[1-[3-(2-oxo-1-benzimidazolyl)propyl]-4-piperidyl]benzimidazol-2-one, methyl [5-(4-fluorobenzoyl)benzimidazol-2-yl]carbamate, 2-(4-fluorophenyl)-4,5-diphenylimidazole, 2-heptadecylimidazole, 2-[[[3-methyl-4-(2,2,2-trifluoroethoxy)-2-pyridyl]methyl]sulfinyl]benzimidazole, 5-methoxy-2-[[(4-methoxy-3,5-dimethyl-2-pyridyl)methyl]thio]benzimidazole, methyl [5-(phenylsulfinyl)benzimidazol-2-yl]carbamate, 5-(difluoromethoxy)-2-[[(3,4-dimethoxy-2-pyridyl)methyl]thio]benzimidazole, 4-(4-fluorophenyl)-2-(4-nitrophenyl)-5-(4-pyridyl)-1H-imidazole, 9-phenyl-3,6-bis[4-(1-phenylbenzimidazol-2-yl)phenyl]carbazole, 1-phenyl-2-[3-(4,4,5,5-tetramethyl-1,3,2-dioxaborolan-2-yl)phenyl]-1H-benzimidazole, 4'-[[4-methyl-6-(1-methyl-1H-benzimidazol-2-yl)-2-propyl-1H-benzimidazol-1-yl]methyl]biphenyl-2-carboxylic acid, 4-formyl-1-tritylimidazole, methyl [5-(propylthio)benzimidazol-2-yl]carbamate, 1-allylimidazole, 5-amino-2-(4-aminophenyl)benzimidazole, 2-aminobenzimidazole, 5-aminobenzimidazole, 2-amino-4,5-dicyano-1H-imidazole, 4(5)-amino-5(4)-cyanoimidazole, 5-amino-2-mercaptobenzimidazole, 1-(3-aminopropyl)imidazole, 6-(1-methyl-4-nitroimidazol-5-yl)thiopurine, benzimidazole, 5-carboxybenzimidazole, 2-(4-aminophenyl)benzimidazole, 1-benzylimidazole, 1-benzyl-2-methylimidazole, 2,2'-biimidazole, 4,5-bis(hydroxymethyl)imidazole, 4,5-bis(hydroxymethyl)-2-phenylimidazole, 1,4-bis[(1H-imidazol-1-yl)methyl]benzene, N-tert-butoxycarbonylimidazole, 1-(dimethylsulfamoyl)-2-(tert-butyldimethylsilyl)-1H-imidazole, 1-(tert-butyldimethylsilyl)imidazole, 1-tert-butylimidazole, 1-butylimidazole, 2-butylimidazole, 2-butyl-4-formylimidazole, 1,1'-carbonyldiimidazole, 1-(2-cyanoethyl)-2-methylimidazole, 1-(2-cyanoethyl)-2-phenylimidazole, 1-(2-cyanoethyl)-2-undecylimidazole, 4(5)-cyanomethylimidazole, 1-(4-cyanophenyl)imidazole, 5-(3,3-dimethyltriazeno)imidazole-4-carboxamide, 5,6-diamino-2-hydroxybenzimidazole, diethyl 2-propyl-1H-imidazole-4,5-dicarboxylate, 1-(2,6-diisopropylphenyl)imidazole, 1,2-dimethylbenzimidazole, 5,6-dimethylbenzimidazole, 1-(dimethylethylsilyl) imidazole, 1,2-dimethylimidazole, dimethyl 1H-imidazole-4,5-dicarboxylate, 1-(dimethylisopropylsilyl)imidazole, 1,2-dimethyl-5-nitroimidazole, 4,5-diphenylimidazole, ethyl 4-(2-hydroxy-2-propyl)-2-propyl-1H-imidazole-5-carboxylate, 1-ethylimidazole, 2-ethylimidazole, 4(5)-ethylimidazole, ethyl 2-imidazolecarboxylate, ethyl 4-imidazolecarboxylate, 2-ethyl-4-methylimidazole, ethyl 1-methylimidazole-2-carboxylate, tetrahydroimidazo[4,5-d]imidazole-2,5(1H,3H)-dione, 2-hydroxybenzimidazole, 1-(10-hydroxydecyl) imidazole, 2-(1-hydroxyethyl)benzimidazole, 2-(hydroxymethyl)benzimidazole, 2-hydroxymethyl-1-methylimidazole, 4-hydroxymethyl-5-methylimidazole, 2-hydroxymethyl-1-methyl-5-nitroimidazole, 2-(3-hydroxypropyl)benzimidazole, 1-imidazoleacetic acid, 2-formylimidazole, 4-formylimidazole, 2-imidazolecarboxylic acid, 4-imidazolecarboxylic acid, imidazole-4,5-dicarboxamide, 1H-imidazole-4,5-dicarboxylic acid, 1-(cyanomethyl)imidazole, 1-(4-formylphenyl)imidazole, 1 isopropylimidazole, 2-isopropylimidazole, methyl [5-(benzoyl)benzimidazol-2-yl]carbamate, 1-methylbenzimidazole, 2-methylbenzimidazole, 5-methylbenzimidazole, methyl benzimidazole-5-carboxylate, methyl 5-(hydroxymethyl)-1H-imidazole-4-carboxylate, 1-methylimidazole, 2-methylimidazole, 4-methylimidazole, 2-formyl-1-methylimidazole, methyl 1H-imidazole-5-carboxylate, 1-methyl-4-imidazolecarboxylic acid, 4,5-dicarboxy-1-methyl-1H-imidazole, 2-methyl-5-nitroimidazole-1-ethanol, 4-methyl-2-phenylimidazole, 6-carboxy-4-methyl-2-propylbenzimidazole, 2-methyl-1-vinylimidazole, 5-nitrobenzimidazole, 2-nitroimidazole, 4-nitroimidazole, 2-nonylbenzimidazole, 1,1'-oxalyldiimidazole, 1-(phenylethyl)imidazole, 2-phenylbenzimidazole, 1-phenylimidazole, 2-phenylimidazole, 4-phenylimidazole, 2-(4-piperidinyl)benzimidazole, 1-propylimidazole, 2-propylimidazole, 2-(2-pyridyl)benzimidazole, 2-(4-pyridyl)benzimidazole and 2,4,5-triphenylimidazole.

Examples of the triazole derivative include, for example, 1-aminobenzotriazole, 2-aminobenzotriazole, 4-amino-3-hydrazino-5-mercapto-1,2,4-triazole, 3-amino-5-mercapto-1,2,4-triazole, 3-amino-5-methylthio-1H-1,2,4-triazole, N-(2-aminophenyl)-4-[1-[2-(3-thienyl)ethyl]-1H-1,2,3-triazol-4-yl]benzamide, 3-amino-1,2,4-triazole, 4-amino-1,2,4-triazole, 1,2,3-benzotriazole, 1-formyl-1H-benzotriazole, 5-carboxybenzotriazole, 1-(hydroxymethyl)-1H-benzotriazole, 2-(2H-benzotriazol-2-yl)-4,6-bis(1-methyl-1-phenylethyl)phenol, 9-(1H-benzotriazol-1-ylmethyl)-9H-carbazole, 1-tert-butoxycarbonyl-1,2,4-triazole, 2-(5-tert-butyl-2-hydroxyphenyl)benzotriazole, 1,1'-carbonyldi(1,2,4-triazole), 5-chlorobenzotriazole, 2-(2-hydroxy-3-tert-butyl-5-methylphenyl)-5-chlorobenzotriazole, 1-(chloromethyl)-1H-benzotriazole, 3-(chloromethyl)-1,2,4-triazolin-5-one, 3-chloro-1,2,4-triazole, 3,5-diamino-1,2,4-triazole, 2-(3,5-di-tert-amyl-2-hydroxyphenyl)benzotriazole, 4,7-dibromo-2-(6-bromohexyl)benzotriazole, 3,5-dibromo-1,2,4-triazole, 2-(3,5-di-tert-butyl-2-hydroxyphenyl)-5-chlorobenzotriazole, 3,5-dimethyl-1,2,4-triazole, 2,6-di(2H-1,2,3-triazol-4-yl)pyridine, ethyl 1-hydroxy-1H-1,2,3-triazole-4-carboxylate, 1-[(9H-fluoren-9-ylmethoxy)carbonyloxy] benzotriazole, 1-(formamidomethyl)-1H-benzotriazole, 2-[2-hydroxy-5-[2-(methacryloyloxy)ethyl]phenyl]-2H-benzotriazole, 2-(2-hydroxy-5-methylphenyl)benzotriazole, 2-(2-hydroxy-5-tert-octylphenyl)benzotriazole, 1-hydroxy-6-(trifluoromethyl)benzotriazole, 1-(isocyanomethyl)-1H-benzotriazole, 1-bis(4-cyanophenyl)methyl-1,2,4-triazole, 3-mercapto-4-methyl-4H-1,2,4-triazole, 3-mercapto-1,2,4-triazole, 1-(methoxymethyl)-1H-benzotriazole, 1-methyl-1H-benzotriazole, 5-methyl-1H-benzotriazole, 2,2'-methylenebis[6-(benzotriazol-2-yl)-4-tert-octylphenol], methyl 1,2,4-triazole-3-carboxylate, 5-methyl-2-(2H-1,2,3-triazol-2-yl)benzoic acid, 1-(4-nitrobenzyl)-1,2,4-triazole, 1,4-diphenyl-endoanilino-dihydrotriazole, 3-nitro-1,2,4-triazole, 2-n-octylbenzotriazole, 1-(4-chlorophenyl)-4,4-dimethyl-3-(1H-1,2,4-triazol-1-ylmethyl)-3-pentanol, 1,2,4-triazole, 1H-1,2,3-triazole, 1,2,4-triazole-3-carboxamide, 4-azabenzotriazole, 1-hydroxy-7-azabenzotriazole, 1-(4-aminophenyl)-1,2,4-triazole, 1-(4-formylphenyl)-1,2,4-triazole, 1-(2,4-difluorobenzoylmethyl)-1H-1,2,4-triazole, 1-(4-aminobenzyl)-1,2,4-triazole, 3-(2-pyridyl)-1,2,4-triazole, 1-(trifluoromethanesulfonyl)-1H-benzotriazole, 3-(trifluoromethyl)-5-(2-pyridyl)-1,2,4-triazole, 1-(2,4,6-triisopropylphenylsulfonyl)-1,2,4-triazole, 1-(trimethylsilyl)-1H-benzotriazole, 1-[2-(trimethylsilyl)ethoxycarbonyloxy] benzotriazole, 3-nitro-1-[2-(trimethylsilyl)ethoxycarbonyl]-1H-1,2,4-triazole, tris(1H-benzotriazol-1-yl)methane and tris(3-hydroxypropyltriazolylmethyl)amine.

Examples of the pyrazole derivative include, for example, pyrazole, 1-allyl-3,5-dimethylpyrazole, 3-amino-5-tert-butylpyrazole, 5-amino-1,3-diphenylpyrazole, 5-amino-1-(2-hydroxyethyl)pyrazole, 3-amino-5-hydroxypyrazole, 5-amino-3-(4-methoxyphenyl)-1-phenylpyrazole, 3-amino-5-(4-methoxyphenyl)pyrazole, 5-amino-3-methyl-1-phenylpyrazole, 4-amino-1-methyl-3-propylpyrazole-5-carboxamide, 3-amino-1-methylpyrazole, 3-amino-5-methylpyrazole, 5-amino-3-methyl-1-p-tolylpyrazole, 3-amino-5-phenylpyrazole, 5-amino-1-phenylpyrazole, 3-aminopyrazole, anthra[1,9-cd]pyrazol-6(2H)-one, 1-benzyl-1H-pyrazole-4-carboxaldehyde, N-(tert-butoxycarbonyl)-1H-pyrazole-1-carboxamidine, N-(carbobenzoxy)-1H-pyrazole-1-carboxamidine, diethyl pyrazole-3,5-dicarboxylate, 3,5-diisopropylpyrazole, 3,5-dimethyl-1-hydroxymethylpyrazole, 3,5-dimethyl-1-phenylpyrazole, 1,3-dimethylpyrazole, 1,5-dimethylpyrazole, 3,5-dimethylpyrazole, 1-carbamoyl-3,5-dimethylpyrazole, 1,3-dimethyl-1H-pyrazole-5-carboxylic acid, 2,4-dihydro-2,5-dimethyl-3H-pyrazol-3-one, 3,5-diphenylpyrazole, 3,5-di(2-pyridyl)pyrazole, ethyl 5-amino-1-methylpyrazole-4-carboxylate, ethyl 5-amino-1-phenylpyrazole-4-carboxylate, ethyl 3-aminopyrazole-4-carboxylate, ethyl 1,3-dimethylpyrazole-5-carboxylate, ethyl 1,5-dimethylpyrazole-3-carboxylate, ethyl 3-methylpyrazole-5-carboxylate, 1-ethyl-3-methylpyrazole-5-carboxylic acid, 1-ethylpyrazole, ethyl pyrazole-3-carboxylate, ethyl 4-pyrazolecarboxylate, 5-formamido-1-[2-(formyloxy)ethyl]pyrazole, 1,2-benzopyrazole, 1-isopropylpyrazole, methyl 1,5-dimethylpyrazole-3-carboxylate, methyl 5-methylpyrazole-3-carboxylate, 5-carbamoyl-1-methyl-4-nitro-3-propylpyrazole, 3-methyl-4-nitropyrazole, 3-methyl-1-phenylpyrazole, 5-methyl-1-phenylpyrazole-4-carboxylic acid, 1-methylpyrazole, 3-methylpyrazole, 4-methylpyrazole, 4-formyl-1-methylpyrazole, 5-formyl-1-methylpyrazole, 4-formyl-3-methylpyrazole, methyl pyrazole-3-carboxylate, 1-methylpyrazole-3-carboxylic acid, 1-methylpyrazole-4-carboxylic acid, 1-methylpyrazole-5-carboxylic acid, 5-(hydroxymethyl)-1-methylpyrazole, 1-nitropyrazole, 3-nitropyrazole, 4-nitropyrazole, 1-phenylpyrazole, 3-phenylpyrazole, 4-aminopyrazole, 3-formylpyrazole, pyrazole-3-carboxylic acid, pyrazole-4-carboxylic acid, 2,4-dihydro-3H-pyrazol-3-one, 5-(2-aminophenyl)pyrazole, 4-(1H-pyrazol-1-yl)benzoic acid, 3-(2-hydroxyphenyl)pyrazole, 3-(2-pyridyl)pyrazole, 1-(tetrahydro-2H-pyran-2-yl)-1H-pyrazole and 1,3,5-trimethylpyrazole.

Examples of the triazine derivative include, for example, 3-amino-5,6-dimethyl-1,2,4-triazine, 2-amino-4-methoxy-6-methyl-1,3,5-triazine, 6-amino-1,3,5-triazine-2,4-diol, 2,4-diamino-6-hydroxy-1,3,5-triazine, 2-amino-4-hydroxy-1,3,5-triazine, 2,4-diamino-6-phenyl-1,3,5-triazine, 2-(tert-butylamino)-4-(cyclopropylamino)-6-(methylthio)-1,3,5-triazine, 2,4-diamino-6-(cyclopropylamino)-1,3,5-triazine, 2,4-diamino-6-butylamino-1,3,5-triazine, 2,4-diamino-6-diallylamino-1,3,5-triazine, 2,4-diamino-6-diethylamino-1,3,5-triazine, 2,4-diamino-6-dimethylamino-1,3,5-triazine, 2,4-diamino-6-isopropoxy-1,3,5-triazine, 2,4-diamino-6-methoxy-1,3,5-triazine, 2,4-diamino-6-[2-(2-methyl-1-imidazolyl)ethyl]-1,3,5-triazine, 2,4-diamino-6-methyl-1,3,5-triazine, 2,4-diamino-1,3,5-triazine, 3-(diethoxyphosphoryloxy)-1,2,3-benzotriazin-4(3H)-one, 3,4-dihydro-3-hydroxy-4-oxo-1,2,3-benzotriazine, 3,4-dihydro-4-oxo-1,2,3-benzotriazine, 2,4-dimethoxy-1,3,5-triazine, 2,4,6-triamino-1,3,5-triazine, 4-amino-3-methyl-6-phenyl-1,2,4-triazin-5-one, 2-methoxy-4-methyl-6-(methylamino)-1,3,5-triazine, 1,3,5-tri(meth)acryloylhexahydro-1,3,5-triazine, 1,3,5-triazine, 1,3,5-trimethylhexahydro-1,3,5-triazine and 2-vinyl-4,6-diamino-1,3,5-triazine.

Examples of the pyridine derivative include, for example, 5-bromopyridine-3-carboxamide, 4-(4-aminophenoxy)-N-methyl-2-pyridinecarboxamide, 2,6-bis[(2R,4S,5S)-1-benzyl-4,5-diphenylimidazolidin-2-yl]pyridine, 2,6-bis[3-(9H-carbazol-9-yl)phenyl]pyridine, 2,6-bis[(2S,5S)-4,4-diphenyl-1-aza-3-oxabicyclo[3.3.0]octan-2-yl]pyridine, 2,6-bis[(2S,4S)-4-methyl-5,5-diphenyloxazolidin-2-yl]pyridine, 2,6-bis(9H-carbazol-9-yl)pyridine, 3,5-di(1-pyrenyl) pyridine, 2,6-bis(2-benzimidazolyl)pyridine, (R,R)-2,6-bis (4-isopropyl-2-oxazolin-2-yl)pyridine, (S,S)-2,6-bis(4-isopropyl-2-oxazolin-2-yl)pyridine, (R,R)-2,6-bis(4-phenyl-2-oxazolin-2-yl)pyridine, (S,S)-2,6-bis(4-phenyl-2-oxazolin-2-yl)pyridine, 2,2'-dithiobis(5-nitropyridine), 6,6'-dithiobis(3-pyridinecarboxylic acid), 2-[N,N-bis (trifluoromethylsulfonyl)amino]pyridine, 2-(tribromomethanesulfonyl)pyridine, N-(isopropylcarbamoyl)-4-(m-tolylamino)pyridine-3-sulfonamide, 4-methoxy-2-(tributylstannyl)pyridine, 2-(tributylstannyl)pyridine, 2,4,6-triphenylpyridine, 2-acetamido-5-iodopyridine, 2-amino-5-bromo-3-iodopyridine, 2-amino-5-chloro-3-iodopyridine, 2-amino-3,5-dibromo-6-methylpyridine, 2-amino-3,5-dibromopyridine, 3-amino-2,5-dibromopyridine, 3-amino-2, 6-dibromopyridine, 4-amino-3,5-dibromopyridine, 4-(4-amino-3-fluorophenoxy)-N-methyl-2-pyridinecarboxamide, 3-amino-2-methoxy-5-(4,4,5,5-tetramethyl-1,3,2-dioxaborolan-2-yl)pyridine, 2-amino-7-isopropyl-5-oxochromeno [2,3-b]pyridine-3-carboxylic acid, 3-benzyloxy-5-bromopyridine, 2,6-bis(bromomethyl)pyridine, 2-bromo-6-benzyloxypyridine, 2-bromo-3-chloro-5-(trifluoromethyl)pyridine, 2-bromo-5-iodo-3-methylpyridine, 2-bromo-3-(4,4,5,5-tetramethyl-1,3,2-dioxaborolan-2-yl)pyridine, 2-bromo-6-(4,4,5,5-tetramethyl-1,3,2-dioxaborolan-2-yl)pyridine, 4-[(tert-butoxycarbonylamino)methyl]pyridine-2-carboxylic acid, 2-chloro-N-(2-chloro-4-methylpyridin-3-yl)pyridine-3-carboxamide, 3,5-dibromo-4-formylpyridine, 4,7-dibromo[1,2,5]thiadiazolo[3,4-c]pyridine, 4-(4-diethylaminophenylazo)pyridine, 2-(2,4-dinitrobenzyl)pyridine, 4-(2,4-dinitrobenzyl)pyridine, ethyl 3-chloro-5-(trifluoromethyl)pyridine-2-carboxylate, 5-ethyl-2-[2-(4-nitrophenoxy)ethyl]pyridine, methyl 5-bromo-2-chloro-3-pyridinecarboxylate, 2,2'-[methylenebis(dimethylsilylene)]bispyridine, 2-(N-L-phenylalaninol)-5-nitropyridine, 2-phenyl-5-(4,4,5,5-tetramethyl-1,3,2-dioxaborolan-2-yl)pyridine, 3-[3-(4,4,5,5-tetramethyl-1,3,2-dioxaborolan-2-yl)phenyl]pyridine, 4-[3-(4,4,5,5-tetramethyl-1,3,2-dioxaborolan-2-yl)phenyl]pyridine, 4-[4-(4,4,5,5-tetramethyl-1,3,2-dioxaborolan-2-yl)phenyl]pyridine, 4-(m-tolylamino)-3-sulfamoylpyridine, 5-(m-tolyl)-5H-pyrrolo[3,2-c:4,5-c']dipyridine, 3-(3,4-dimethoxyphenyl)-2-(pyridin-3-yl)(meth)acrylonitrile, 3-(3,5-dichlorophenyl)-2-(pyridin-3-yl)(meth)acrylonitrile, 2-acetamido-5-bromo-4-methylpyridine, 2-acetamido-5-bromopyridine, 2-acetyl-6-bromopyridine, 3-acetyl-5-bromopyridine, 5-acetyl-2-bromopyridine, 2-amino-3-benzyloxypyridine, 2-amino-3-bromo-5-chloropyridine, 3-amino-2-bromo-5-chloropyridine, 3-amino-5-bromo-2-chloropyridine, 3-amino-6-bromo-2-chloropyridine, 5-amino-3-bromo-2-chloropyridine, 2-amino-3-bromo-5,6-dimethylpyridine, 2-amino-5-bromo-4-methyl-3-nitropyridine, 2-amino-5-bromo-3-nitropyridine, 2-amino-6-(tert-butoxycarbonylamino)pyridine, 2-amino-5-iodo-3-methylpyridine, 2-amino-5-iodo-4-methylpyridine and 2-amino-3-iodopyridine.

Examples of the terpyridine derivative include, for example, 4'-(4-bromophenyl)-2,2':6',2"-terpyridine, 4'-bromo-2,2':6',2"-terpyridine, diethyl 2,2':6',2"-terpyridine-4'-phosphonate, 1,4-di[[2,2':6',2"-terpyridin]-4'-yl]benzene, 4'-(methoxycarbonyl)-2,2':6',2"-terpyridine, 2,2':6',2"-terpyridine and trimethyl 2,2':6',2"-terpyridine-4,4',4"-tricarboxylate.

Examples of the bipyridine derivative include, for example, 2,2'-bipyridine-6-carbonitrile, 2,2'-bipyridine-3,3'-dicarboxylic acid, 2,2'-bipyridine-4,4'-dicarboxylic acid, 2,2'-bipyridine-5,5'-dicarboxylic acid, 2,2'-bipyridine-6,6'-dicarboxylic acid, 2,2'-bipyridine-3,3'-diol, 2,2'-bipyridine-6,6'-diol, 2,2'-bipyridine, 2,4'-bipyridine, 3,3'-bipyridine, 4,4'-bipyridine, 6,6'-bis(chloromethyl)-2,2'-bipyridine, 4,4'-bis(5-hexyl-2-thienyl)-2,2'-bipyridine, 4,4'-bis(hydroxymethyl)-2,2'-bipyridine, 1,2-bis(4'-methyl-2,2-bipyridin-4-yl)ethane, 5,5'-bis(trifluoromethyl)-2,2'-bipyridine, 6-bromo-2,2'-bipyridine, 6-bromo-4,4'-dimethyl-2,2'-bipyridine, 4-(bromomethyl)-4'-methyl-2,2'-bipyridine, 4-(chloromethyl)-4'-methyl-2,2'-bipyridine, 4,4'-diamino-2,2'-bipyridine, 2,2'-bipyridine-6,6'-diamine, 4,4'-dibromo-2,2'-bipyridine, 5,5'-dibromo-2,2'-bipyridine, 6,6'-dibromo-2,2'-bipyridine, 4,4'-di-tert-butyl-2,2'-bipyridine, 2,2'-bipyridine-6,6'-dicarbonitrile, 4,4'-dimethoxycarbonyl-2,2'-bipyridine, 6,6'-dimethoxycarbonyl-2,2'-bipyridine, 4,4'-dimethyl-(2,2'-bipyridin)-3-ol, 4-hydroxymethyl-4'-methyl-2,2'-bipyridine and 6'-methoxy-2,3'-bipyridine.

Examples of the phenanthroline derivative include, for example, 2,9-dimethyl-4,7-diphenyl-1,10-phenanthroline, 4,7-diphenyl-1,10-phenanthroline, 2-bromo-1,10-phenanthroline, 3-bromo-1,10-phenanthroline, 5-bromo-1,10-phenanthroline, 2-chloro-1,10-phenanthroline, 5-chloro-1,10-phenanthroline, 3,8-dibromo-1,10-phenanthroline, 2,9-dibutyl-1,10-phenanthroline, 2,9-dibutyl-5-picrylamino-1,10-phenanthroline, 2,9-dichloro-1,10-phenanthroline, 4,7-dihydroxy-1,10-phenanthroline, 4,7-dimethyl-1,10-phenanthroline, 5,6-dimethyl-1,10-phenanthroline, 2,9-dimethyl-5-picrylamino-1,10-phenanthroline, 2,9-diphenyl-1,10-phenanthroline, 2-methyl-1,10-phenanthroline, 5-nitro-1,10-phenanthroline, 1,10-phenanthroline-5,6-dione, (1S)-3-(1,10-phenanthrolin-2-yl)-2'-phenyl-[1,1'-binaphthalen]-2-ol, 3,5,6,8-tetrabromo-1,10-phenanthroline and 3,4,7,8-tetramethyl-1,10-phenanthroline.

Examples of the pyrimidine derivative include, for example, pyrimidine, 4-methylpyrimidine, 5-aminopyrimidine, 2-aminopyrimidine, 4-aminopyrimidine, 4(3H)-pyrimidinone, 2-chloropyrimidine, 2-mercaptopyrimidine, 2-cyanopyrimidine, 4,6-dichloropyrimidine, 4,6-dimethylpyrimidine, 2,5-dichloropyrimidine, 2,4-dichloropyrimidine, 2-chloro-4-methylpyrimidine, 4-methoxypyrimidine, 2-chloro-5-fluoropyrimidine, 2-chloro-5-methylpyrimidine, 4-chloro-2-methylpyrimidine, 4,6-dihydroxypyrimidine, 2-chloro-4,6-dimethylpyrimidine, 4,6-dimethoxypyrimidine, pyrimidine-5-carboxylic acid, 5-amino-4-chloropyrimidine, 2-chloro-5-ethylpyrimidine, 2-chloro-5-methoxypyrimidine, 4,6-diaminopyrimidine, 5-pyrimidylboronic acid, pyrimidine-2-carboxylic acid, 2-amino-4-methylpyrimidine, 2-amino-5-chloropyrimidine, 4,6-dimethyl-2-mercaptopyrimidine, methyl pyrimidine-2-carboxylate, 2,4-dimethoxypyrimidine, 2-amino-4,6-dimethylpyrimidine, 2,4-diaminopyrimidine, 4,6-dimethyl-2-hydroxypyrimidine, 4-amino-2-chloropyrimidine, 4-chloro-6-hydroxypyrimidine, 2-methylthio-4-pyrimidinol, 4-chloro-6-methoxypyrimidine, 4,5-diaminopyrimidine, 4,6-dihydroxy-2-methylpyrimidine, pyrimidine-4-carboxylic acid, 2,4,6-triaminopyrimidine, 2-amino-5-nitropyrimidine, 4-amino-6-chloropyrimidine, 4-aminopyrimidine-5-carbonitrile, 4,6-dihydroxy-2-mercaptopyrimidine, 2-amino-4-chloro-6-methylpyrimidine, 2-amino-4,6-dihydroxypyrimidine, 4,6-diamino-2-mercaptopyrimidine, 2,4-dimethyl-6-hydroxypyrimidine, 2,4-dihydroxy-5-methoxypyrimidine, 4-amino-2,6-dimethylpyrimidine, 4-amino-6-hydroxypyrimidine, 2-aminopyrimidine-5-boronic acid, 6-chloro-2,4-diaminopyrimidine, 2-amino-4-hydroxy-6-methylpyrimidine, 4-amino-2-chloro-5-fluoropyrimidine, 6-chloropyrimidine-4,5-diamine, 2-amino-4-chloro-6-hydroxypyrimidine, 2-amino-4-methoxy-6-methylpyrimidine, 6-hydroxy-4-pyrimidinecarboxylic acid, 4-amino-5-fluoro-2-methoxypyrimidine, 2,4-diamino-6-hydroxypyrimidine, 4,5-diamino-6-hydroxypyrimidine, 2,4-diamino-6-methoxypyrimidine, 4-amino-2-methyl-5-pyrimidinemethanol, 7H-pyrrolo[2,3-d]pyrimidine, 8-azaadenine, 6-aminopurine, 4-hydroxypyrazolo[3,4-d]pyrimidine, 4-aminopyrazolo[3,4-d]pyrimidine, 2-aminopurine, 8-azahypoxanthine, 4-amino-2-oxo-1,2-dihydropyrimidine, 5-hydroxyuracil, 2-amino-4(1H)-pyrimidinone, 4-amino-5-fluoro-2-hydroxypyrimidine, 3,7-dihydro-4H-pyrrolo[2,3-d]pyrimidin-4-one, 2-chloro-5-fluoro-4-pyrimidinone, 5-fluoro-2-methoxy-4-pyrimidinone, hypoxanthine, 5-bromopyrimidine, 2-bromopyrimidine, 5-bromo-2-fluoropyrimidine, 5-bromo-2-chloropyrimidine, 5-bromo-2-methylpyrimidine, 2,4,6-trichloropyrimidine, pyrimidine-2-sulfonyl fluoride, 4,5,6-trichloropyrimidine, 2,2'-bipyrimidine, 4-chloro-2-(methylthio)pyrimidine, 4,6- dichloro-2-methylpyrimidine, 5-bromo-2-hydroxypyrimidine, 4,6-dichloro-5-methylpyrimidine, 5-amino-4,6-dichloropyrimidine, 2-amino-5-bromopyrimidine, 5-bromo-2-methoxypyrimidine, 5-chloro-2,4,6-trifluoropyrimidine, 4,6-dichloro-2-(methylthio)pyrimidine, 2-amino-4,6-dichloropyrimidine, 2-amino-4,6-dichloropyrimidine, 2,4,5-trichloropyrimidine, 2,4-dichloro-5-fluoropyrimidine, 2-chloro-4-(trifluoromethyl)pyrimidine, 4,6-dichloro-5-methoxypyrimidine, 2-chloro-5-nitropyrimidine, 2,4-dichloro-5-methylpyrimidine, 2,4-dichloro-6-methylpyrimidine, 2,4,6-trimethoxypyrimidine, 2,4-dichloro-5-methoxypyrimidine, 2-chloro-4,6-dimethoxypyrimidine, 4,6-dimethyl-2-(methylsulfonyl)pyrimidine, 5-amino-4,6-dichloro-2-methylpyrimidine, 4,6-dihydroxy-2-methylthiopyrimidine, 2,5-diamino-4,6-dichloropyrimidine, 2-amino-4,6-dimethoxypyrimidine, 2-amino-4-(trifluoromethyl)pyrimidine, 4-chloro-6-methyl-2-(methylthio)pyrimidine, 2-hydroxy-4-(trifluoromethyl)pyrimidine, 2-methoxy-5-pyrimidylboronic acid, 4-hydroxy-6-trifluoromethylpyrimidine, ethyl pyrimidine-4-carboxylate, 2-phenylpyrimidine, 4,6-dihydroxy-5-nitropyrimidine, 2,4-dichloro-5-nitropyrimidine, 4-amino-2,6-dichloropyrimidine, 6-chloro-2,4-dimethoxypyrimidine, 4-amino-5,6-dichloropyrimidine, 2,4,6-triamino-5-nitrosopyrimidine, 2-amino-4-chloro-6-methoxypyrimidine, 4-hydroxy-2-methyl-6-(trifluoromethyl)pyrimidine, 4-amino-6-chloro-2-(methylthio)pyrimidine, 2-hydrazino-4-(trifluoromethyl)pyrimidine, 6-amino-2,4-dimethoxypyrimidine, 4-hydroxy-2-mercapto-6-(trifluoromethyl)pyrimidine, 4-amino-5-chloro-2,6-dimethylpyrimidine, 2-(1-piperazinyl)pyrimidine, 4-amino-2,6-dihydroxy-5-nitrosopyrimidine, 4-amino-2-dimethylamino-6-hydroxy-5-nitrosopyrimidine, 1-(2-pyrimidinyl)-1H-indole, 4-chloro-7H-pyrrolo[2,3-d]pyrimidine, 2,4-dichloro-7H-pyrrolo[2,3-d]pyrimidine, 4,6-dibromopyrimidine, 2,5-dibromopyrimidine, 2-chloro-5-iodopyrimidine, 5-bromo-2-tert-butylpyrimidine, 5-bromo-2,4-dichloropyrimidine, 2,4,5,6-tetrachloropyrimidine, 5-bromo-4-chloro-2-(methylthio)pyrimidine, 4,6-dichloro-2-(methylsulfonyl)pyrimidine, methyl 5-bromopyrimidine-2-carboxylate, 5-bromo-2,4-dimethoxypyrimidine, 2,4,6-trichloro-5-formylpyrimidine, 2-(tert-butoxycarbonylthio)-4,6-dimethylpyrimidine, 4,6-dimethoxy-2-(methylsulfonyl)pyrimidine, 2-amino-4,6-dichloro-5-formamidopyrimidine, 5-amino-4,6-dichloro-2-(propylthio)pyrimidine, 4,6-dichloro-2-phenylpyrimidine, ethyl 2,4-dichloropyrimidine-5-carboxylate, 5-bromo-2-(methylthio)pyrimidine-4-carboxylic acid, ethyl 4-chloro-2-(methylthio)pyrimidine-5-carboxylate, 5-chloro-2-(methylthio)pyrimidine-4-carboxylic acid, 2-chloro-5-(4,4,5,5-tetramethyl-1,3,2-dioxaborolan-2-yl)pyrimidine, 2-amino-4,6-diphenylpyrimidine, 2-amino-5-(4,4,5,5-tetramethyl-1,3,2-dioxaborolan-2-yl)pyrimidine, 2-(4-morpholino)-4,6-dichloropyrimidine, 5-(4-chlorophenyl)-6-ethyl-2,4-pyrimidinediamine, 2,4-dichloro-6-(4-morpholino)pyrimidine, 4-chloro-N-(4,5-dihydro-1H-imidazol-2-yl)-6-methoxy-2-methyl-5-pyrimidinamine, 2,4-dichlorothieno[3,2-d]pyrimidine and 4-chlorobenzofuro[3,2-d]pyrimidine.

Examples of the pyrazine derivative include, for example, pyrazine, 2-acetyl-3-ethylpyrazine, 2-acetyl-3-methylpyrazine, 2-acetylpyrazine, 2-amino-5-bromo-3-methoxypyrazine, 2-amino-5-bromopyrazine, 2-amino-3-chloropyrazine, 2-amino-5-chloropyrazine, 2-amino-6-chloropyrazine, 2-amino-3,5-dibromopyrazine, 2-(aminomethyl)-5-methylpyrazine, 2-amino-6-methylpyrazine, 2-amino-5-phenylpyrazine, 2-aminopyrazine, 3-aminopyrazine-2-carboxylic acid, 2,2'-bipyrazine, 2-bromo-5-hydroxypyrazine, 2-bromopyrazine, 2-sec-butyl-3-methoxypyrazine, 2-butyl-3-methylpyrazine, 2-tert-butylpyrazine, 2-chloro-3,5-dimethylpyrazine, 3-chloro-2,5-dimethylpyrazine, 5-chloro-2,3-diphenylpyrazine, 2-chloro-6-methylpyrazine, chloropyrazine, 3-chloropyrazine-2-carboxamide, 5-chloropyrazine-2-carboxylic acid, 6-chloropyrazine-2-carboxylic acid, 6,8-dibromoimidazo[1,2-a]pyrazine, 2,5-dibromopyrazine, 2,6-dibromopyrazine, 2,3-dichloropyrazine, 2,6-dichloropyrazine, cyanopyrazine, 5,6-diamino-2,3-dicyanopyrazine, 5,6-dichloro-2,3-dicyanopyrazine, 2,3-dicyano-5-methylpyrazine, 2,3-dicyanopyrazine, 2,3-diethyl-5-methylpyrazine, 2,3-diethylpyrazine, 2,3-dimethylpyrazine, 2,5-dimethylpyrazine, 2,6-dimethylpyrazine, 2-ethoxy-3-ethylpyrazine, 2-ethoxy-3-isopropylpyrazine, 2-ethoxy-3-methylpyrazine, 2-ethoxypyrazine, 5-ethyl-2,3-dimethylpyrazine, 2-ethyl-3-methylpyrazine, 2-ethyl-3-(methylthio)pyrazine, ethyl 3-oxo-3-(pyrazine-2-yl)propionate, 2-ethylpyrazine, 2-furfurylthio-3-methylpyrazine, N-[4-(3-cyclohexylureidosulfonyl)phenethyl]-5-methyl-2-pyrazinecarboxamide, 2-hydroxy-3-methylpyrazine, 3-hydroxypyrazine-2-carboxamide, 2-iodopyrazine, 2-isobutyl-3-methoxypyrazine, 2-isobutyl-3-methylpyrazine, 2-isopropyl-3-methoxypyrazine, (2-mercaptoethyl)pyrazine, 2-methoxy-3-methylpyrazine, 2-methoxypyrazine, methyl 3-amino-6-bromopyrazine-2-carboxylate, methyl 3-aminopyrazine-2-carboxylate, methyl 3-chloropyrazine-2-carboxylate, methyl 3,5-diamino-6-chloropyrazine-2-carboxylate, 5H-5-methyl-6,7-dihydrocyclopentapyrazine, 2-methyl-3-isopropoxypyrazine, 2-methyl-3-(methylthio)pyrazine, 2-methyl-3-propylpyrazine, 2-methylpyrazine, methyl 2-pyrazinecarboxylate, 5-methylpyrazine-2-carboxylic acid, 2-carboxy-5-methylpyrazine 4-oxide, 2-(methylthio)pyrazine, benzo[d]pyrazin-1(2H)-one, 2-propylpyrazine, pyrazinamide, pyrazinecarboxylic acid, 2,3-pyrazinedicarboxylic acid, pyrazine-2,3-dicarboxylic acid monoamide, 2-pyrazinemethanol, 4-amino-N-(3-methoxypyrazin-2-yl)benzenesulfonamide, 1,4,5,6-tetrahydro-5,6-dioxo-2,3-pyrazinedicarbonitrile, 2,3,5,6-tetramethylpyrazine, 2,3,5-trimethylpyrazine and 2-vinylpyrazine.

Examples of the pyridazine derivative include, for example, pyridazine, 3-amino-6-chloropyridazine, 3-aminopyridazine, 3-bromoimidazo[1,2-b]pyridazine, 6-chloroimidazo[1,2-b]pyridazine, 3-chloro-6-methoxypyridazine, 3-chloro-6-methylpyridazine, 3-chloro-6-phenylpyridazine, 6-chloro-3(2H)-pyridazinone, 3,6-dibromopyridazine, 3,6-dichloro-4-methylpyridazine, 3,5-dichloropyridazine, 3,6-dichloropyridazine, 4,5-dichloro-3(2H)-pyridazinone, 6-hydroxypyridazine-3-carboxylic acid, imidazo[1,2-b]pyridazine, maleic hydrazide, 3-methoxypyridazine, methylmaleic hydrazide, 3-methylpyridazine, 4-methylpyridazine, 3-hydroxy-6-methylpyridazine, 3-hydroxy-6-phenylpyridazine, pyridazine-4-carboxylic acid, 4-amino-N-(6-methoxy-3-pyrazinyl)benzenesulfonamide, 1,4,5,6-tetrahydro-6-oxopyridazine-3-carboxylic acid and 3,4,6-trichloropyridazine.

Examples of the quinazoline derivative include, for example, quinazoline, 6-acetoxy-7-methoxy-3H-quinazolin-4-one, 4-amino-2-chloro-6,7-dimethoxyquinazoline, 7-benzyloxy-6-methoxy-3H-quinazolin-4-one, 6,7-bis(2-methoxyethoxy)-3H-quinazolin-4-one, 6-bromo-4-hydroxyquinazoline, N-4-(3-bromophenyl)quinazoline-4,6-diamine, 4-chloro-6,7-dimethoxyquinazoline, 4-[3-chloro-4-(3-fluorobenzyloxy)phenylamino]-6-iodoquinazoline, 4-chloro-6-iodoquinazoline, 2-(chloromethyl)-4-methylquinazoline, 7-chloro-6-nitro-4-hydroxyquinazoline, 2-chloro-4-phenylquinazoline, (E)-N-[4-[(3-chloro-4-fluorophenyl)amino]-7-methoxyquinazolin-6-yl]-4-(piperidin-1-yl)but-2- enamide, N,N'-dibenzylquinazoline-2,4-diamine, 2,4-dichloro-6,7-dimethoxyquinazoline, 6,7-dimethoxyquinazoline-2,4-dione, 6,7-dimethoxy-3H-quinazolin-4-one, 7-fluoro-4-hydroxyquinazoline, 7-fluoro-6-nitroquinazolin-4(1H)-one, 4-hydroxyquinazoline, 6-iodo-4-hydroxyquinazoline, 3-[2-[4-(4-fluorobenzoyl)-1-piperidinyl]ethyl]-2,4(1H,3H)-quinazolinedione, 8,13-dihydroindolo[2',3':3,4]pyrido[2,1-b]quinazolin-5(7H)-one and N-(3-chlorophenyl)-6,7-dimethoxy-4-quinazolinamine.

Examples of the porphyrin derivative include, for example, porphyrin, 5,15-diphenylporphyrin, 2,3,7,8,12,13,17,18-octaethylporphyrin, 2,3,7,8,12,13,17,18-octafluoro-5,10,15,20-tetrakis(pentafluorophenyl)porphyrin, meso-tetraphenylchlorine, tetraphenylporphyrin, 5,10,15,20-tetrakis(4-methoxyphenyl)porphyrin, 5,10,15,20-tetrakis(2,6-dichlorophenyl)porphyrin, 5,10,15,20-tetrakis(4-carboxymethyloxyphenyl)porphyrin, 5,10,15,20-tetrakis(4-hydroxyphenyl)porphyrin, 5,10,15,20-tetrakis(2,4,6-trimethylphenyl)porphyrin, 5,10,15,20-tetrakis(pentafluorophenyl)porphyrin, 5,10,15,20-tetrakis(3,5-dihydroxyphenyl)porphyrin, 5,10,15,20-tetrakis(3,5-dimethoxyphenyl)porphyrin, 5,10,15,20-tetra(4-pyridyl)porphyrin and 5,10,15,20-tetrakis(p-tolyl)porphyrin.

Examples of the phthalocyanine derivative include, for example, phthalocyanine, naphthalocyanine and azulenocyanine.

Examples of the cyclen derivative include, for example, 1,4,7,10-tetraazacyclododecane, 1,4,7,10-tetraazacyclododecane-1,4,7,10-tetraacetic acid, tri-tert-butyl 1,4,7,10-tetraazacyclododecane-1,4,7-triacetate, tri-tert-butyl 1,4,7,10-tetraazacyclododecane-1,4,7,10-tetraacetate and 1,4,7,10-tetrabenzyl-1,4,7,10-tetraazacyclododecane.

Examples of the crown ether derivative include, for example, 12-crown 4-ether, 2-(hydroxymethyl)-12-crown 4-ether, benzo-12-crown 4-ether, 15-crown 5-ether, 2-(hydroxymethyl)-15-crown 5-ether, benzo-15-crown 5-ether, dibenzo-15-crown 5-ether, 4'-bromobenzo-15-crown 5-ether, 4'-aminobenzo-15-crown 5-ether, 4'-formylbenzo-15-crown 5-ether, 4'-acetylbenzo-15-crown 5-ether, 4'-carboxybenzo-15-crown 5-ether, 4'-nitrobenzo-15-crown 5-ether, 18-crown 6-ether, 2-(hydroxymethyl)-18-crown 6-ether, dicyclohexano-18-crown 6-ether, benzo-18-crown 6-ether, dibenzo-18-crown 6-ether, 4'-bromobenzo-18-crown 6-ether, 4'-aminobenzo-18-crown 6-ether, 4'-formylbenzo-18-crown 6-ether, 4'-acetylbenzo-18-crown 6-ether, 4'-carboxybenzo-18-crown 6-ether, 4'-nitrobenzo-18-crown 6-ether, 21-crown 7-ether, dibenzo-21-crown 7-ether, 24-crown 8-ether and dibenzo-24-crown 8-ether.

From the viewpoint of forming a composite with a metal ion, examples of the diketone derivative include, for example, a 1,3-diketone, such as 1,3-diphenyl-1,3-propanedione, 1-(2-mesitylene)-1,3-butanedione, 1,3-bis(4-methoxyphenyl)-1,3-propanedione, 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione.

As the metal ion trapping agent (B), from the viewpoint of ensuring good storage stability of a varnish of the resin composition, for example, the triazine derivative, the bipyridine derivative and the diketone derivative are preferable; 2,4-diamino-6-methyl-1,3,5-triazine, 2,2'-bipyridine, 1,3-diphenyl-1,3-propanedione, 1-(2-mesitylene)-1,3-butanedione, 1,3-bis(4-methoxyphenyl)-1,3-propanedione, 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione are more preferable; and from the viewpoint of ensuring solvent solubility and mobility of the molecule, 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione are still more preferable.

These metal ion trapping agents (B) can be used alone as one kind or can be used in combination of two or more kinds.

Although the content of the metal ion trapping agent (B) in the resin composition is not particularly limited as long as the effect of the present embodiment is achieved, it is preferably 5 parts by mass or more and 50 parts by mass or less based on 100 parts by mass of the total amount of a radical polymerizable compound (C), which will be described below, in the resin composition, more preferably 10 parts by mass or more and 45 parts by mass or less from the viewpoint of ensuring solvent solubility and sufficient flux activity, and still more preferably 15 parts by mass or more and 40 parts by mass or less from the viewpoint of ensuring sufficient flux activity and flexibility of the resin composition.

[I-3. Radical Polymerizable Compound (C)]

Although the radical polymerizable compound (C) is not particularly limited as long as it is a substance having a functional group that is polymerized by radicals, examples thereof include, for example, a (meth)acrylate compound, a maleimide compound and a propenyl compound.

Examples of the (meth)acrylate compound include, for example, methyl (meth)acrylate, ethyl (meth)acrylate, isopropyl (meth)acrylate, isobutyl (meth)acrylate, ethylene glycol di(meth)acylate, diethylene glycol di(meth)acylate, trimethylolpropane tri(meth)acrylate, tetramethylolmethane tetra(meth)acrylate, 2-hydroxy-1,3-di(meth)acryloxypropane, 2,2-bis[4-((meth)acryloxymethoxy)phenyl]propnae, 2,2-bis[4-((meth)acryloxypolyethoxy)phenyl]propane, dicyclopentenyl (meth)acrylate, tricyclodecanyl (meth)acrylate, tris((meth)acryloyloxyethyl)isocyanurate and urethane (meth)acrylate. If necessary, for example, a polymerization inhibitor such as hydroquinone or a methyl ether hydroquinone may be used as appropriate.

The maleimide compound is not particularly limited as long as it is a compound having one or more maleimide groups in the molecule. Examples thereof include, for example, N-phenylmaleimide, N-hydroxyphenylmaleimide, bis(4-maleimidophenyl)methane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, a novolac-based maleimide compound, a biphenyl aralkyl-based maleimide compound, 2,2-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2) and a maleimide compound represented by the following formula (3).

Among the above, from the viewpoint of solubility in an organic solvent, 2,2-bis(4-(4-maleimidophenoxy)phenyl) propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2) and a maleimide compound represented by the following formula (3) are preferable, and 2,2-bis(4-(4-maleimidophenoxy)phenyl)propane, a maleimide compound represented by the following formula (1), a maleimide compound represented by the following formula (2) and a maleimide compound represented by the following formula (3) are more preferable. As the maleimide compound represented by the following formula (3), bis-(3-ethyl-5-methyl-4-maleimidophenyl) methane is preferable.

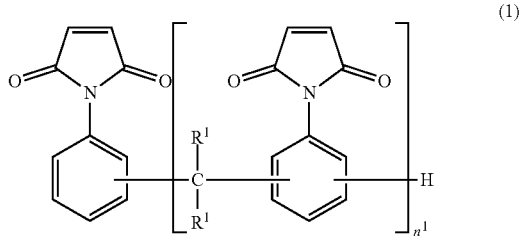
(1)

In the formula (1), each $R^1$ independently represents a hydrogen atom or a methyl group, and from the viewpoint of achieving action effects according to the present embodiment more effectively and reliably, it is preferably a hydrogen atom. In addition, in the formula (1), $n^1$ represents an integer of 1 or more and the upper limit value of $n^1$ is normally 10. From the viewpoint of solubility in an organic solvent, it is preferably 1 to 3.

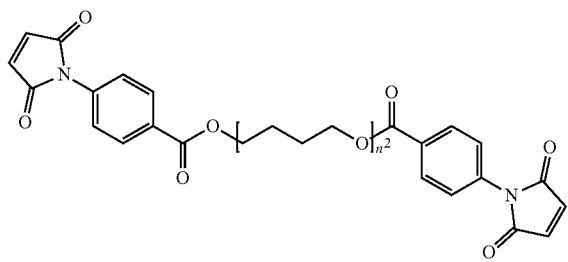
(2)

In the formula (2), the average value of $n^2$ is in the range of 1 or more and 30 or less. From the viewpoint of achieving action effects according to the present embodiment more effectively and reliably, $n^2$ is, as the average value, preferably 7 or more and 30 or less and more preferably 7 or more and 18 or less.

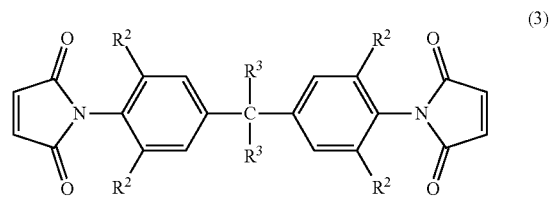
(3)

In the formula (3), each $R^2$ independently represents a hydrogen atom, a methyl group or an ethyl group.

In the formula (3), each $R^3$ independently represents a hydrogen atom or a methyl group.

In addition, from the viewpoint of solubility in an organic solvent and flexibility, the maleimide compound contains a maleimide compound represented by the above formula (1), and along with this, it is more preferable that the maleimide compound should also contain at least one maleimide compound selected from the group consisting of 2,2-bis(4-(4-maleimidophenoxy)phenyl)propane, a maleimide compound represented by the above formula (2) and a maleimide compound represented by the above formula (3).

From the viewpoint of having excellent flux activity, excellent flexibility and a low thermal expansion coefficient in a well balanced manner, the maleimide compound preferably contains a maleimide compound represented by the above formula (1) at 5 parts by mass or more and 50 parts by mass or less based on 100 parts by mass of the entire amount of the maleimide compound, preferably contains a maleimide compound represented by the above formula (2) at 5 parts by mass or more and 70 parts by mass or less, preferably contains a maleimide compound represented by the above formula (3) at 5 parts by mass or more and 50 parts by mass or less, and preferably contains 2,2-bis(4-(4-maleimidophenoxy)phenyl)propane at 5 parts by mass or more and 50 parts by mass or less.

The maleimide compound may also be contained in the resin composition in the form of, for example, a prepolymer obtained by polymerizing the maleimide compound or a prepolymer obtained by polymerizing the maleimide compound with another compound such as an amine compound.

As the maleimide compound, those commercially available may be used, and examples thereof include, for example, BMI-2300 manufactured by Daiwa kasei Industry Co., LTD.; BMI-70, BMI-80, BMI-1000P and BMI-650P manufactured by K•I Chemical Industry Co., LTD.; and MIR3000 manufactured by Nippon Kayaku Co., Ltd.

Examples of the propenyl compound include, for example, a monofunctional propenyl compound such as propenylbenzene, propenylnaphthalene, propenylanthracene, propenylphenol and o-propenylphenoxybenzene; and bispropenylphenyl ether, 2,2-bis[4-(o-propenylphenoxy) phenyl]propane, bis[4-(o-propenylphenoxy)phenyl] ether, bis[4-(o-propenylphenoxy)phenyl]sulfone, 4,4'-bis(o-propenylphenoxy)benzophenone, 2,2-bis[4-(o-propenylphenoxy) phenyl]nonane, 2,2-bis[3-tert-butyl-4-(o-propenylphenoxy) phenyl]propane, 2,2-bis[3-sec-butyl-4-(o-propenylphenoxy) phenyl]propane, 1,1-bis[4-(o-propenylphenoxy)phenyl] decane, 1,1-bis[2-methyl-4-(o-propenylphenoxy)-5-tert-butylphenyl]-2-methylpropane, 4,4'-cyclohexylidene-bis[1-(o-propenylphenoxy)-2-(1,1-dimethylethyl)benzene], 4,4'-methylene-bis[1-(o-propenylphenoxy)-2,6-bis(1,1-dimethylethyl)benzene], 4,4'-methylene-bis[1-(o-propenylphenoxy)-2,6-di-sec-butylbenzene], 4,4'-cyclohexylidene-bis[1-(o-propenylphenoxy)-2-cyclohexylbenzene], 4,4'-methylene-bis[1-(o- propenylphenoxy)-2-nonylbenzene], 4,4'-(1-methylethylidene)-bis[1-(o-propenylphenoxy)-2,6-bis(1,1-dimethylethyl)benzene, 4,4'-(2-ethylhexylidene)-bis[1-(o-propenylphenoxy)-benzene], 4,4'-(1-methylheptylidene)-bis[1-(o-propenylphenoxy)-benzene], 4,4'-cyclohexylidene-bis[1-(o-propenylphenoxy)-3-methylbenzene], 2,2-bis[4-(o-propenylphenoxy)phenyl]-propane, 2,2-bis[4-(o-propenylphenoxy)phenyl]-hexafluoropropane, 2,2-bis[3-methyl-4-(o-propenylphenoxy)phenyl]-propane, 2,2-bis[3-methyl-4-(o-propenylphenoxy)phenyl]-hexafluoropropane, 2,2-bis[3,5-dimethyl-4-(o-propenylphenoxy)phenyl]-propane, 2,2-bis[3,5-dimethyl-4-(o-propenylphenoxy)phenyl]-hexafluoropropane, 2,2-bis[3-ethyl-4-(o-propenylphenoxy)phenyl]-propane, 2,2-bis[3-ethyl-4-(o-propenylphenoxy)phenyl]-hexafluoropropane, bis[3-methyl-(o-propenylphenoxy)phenyl]-methane, bis[3,5-dimethyl-(o-propenylphenoxy)phenyl]-methane, bis[3-ethyl-(o-propenylphenoxy)phenyl]-methane, 3,8-bis[4-(o-propenylphenoxy)phenyl]-tricyclo-[5,2,1,0$^{2,6}$]decane, 4,8-bis[4-(o-propenylphenoxy)phenyl]-tricyclo-[5,2,1,0$^{2,6}$]decane, 3,9-bis[4-(o-propenylphenoxy)phenyl]-tricyclo-[5,2,1,0$^{2,6}$]decane, 4,9-bis[4-(o-propenylphenoxy)phenyl]-tricyclo-[5,2,1,0$^{2,6}$]decane, 1,8-bis[4-(o-propenylphenoxy)phenyl]-methane, 1,8-bis[3-methyl-4-(o-propenylphenoxy)phenyl]-methane and 1,8-bis[3,5-dimethyl-4-(o-propenylphenoxy)phenyl]-methane.

These radical polymerizable compounds (C) can be used alone as one kind or can be used in combination of two or more kinds.

[I-4. Inorganic Filler (D)]

The resin composition of the present embodiment can contain an inorganic filler (D) in order to improve burning resistance, to improve thermal conductivity and to reduce the thermal expansion coefficient. By using an inorganic filler, the burning resistance and thermal conductivity of the resin composition and the like can be improved, and the thermal expansion coefficient can be reduced. In addition, it is preferable that the inorganic filler (D) should have an electrical insulation property from the viewpoint of ensuring more sufficient electrical insulation between the electrodes of chips when the resin composition of the present embodiment is used as the material of an underfill material, preferably a pre-applied underfill material. Here, the "an electrical insulation property" mean that the volume resistivity at normal temperature is $10^{12}$ Ω·cm or more. The type of the inorganic filler (D) is not particularly limited, but examples thereof include, for example, silica such as fused silica; an aluminum compound such as boehmite, aluminum hydroxide, alumina and aluminum nitride; a magnesium compound such as magnesium oxide and magnesium hydroxide; a calcium compound such as calcium carbonate and calcium sulfate; a molybdenum compound such as molybdenum oxide and zinc molybdate; boron nitride; barium sulfate; a talc such as natural talc and calcined talc; mica; and a glass such as short fibrous glass, spherical glass and fine powder glass (for example, E glass, T glass, D glass). These inorganic fillers (D) can be used alone as one kind or can be used in combination of two or more kinds.

Among the above, from the viewpoint of improving the burning resistance and reducing the thermal expansion coefficient of the resin composition, as the inorganic filler (D), silica, aluminum hydroxide, alumina, boehmite, boron nitride, aluminum nitride, magnesium oxide and magnesium hydroxide are preferable, and silica is more preferable. Among the silica, fused silica is still more preferable from the viewpoint of enhanced filling properties, flowability of the underfill material into minute space, and low thermal expansion properties. Examples of the fused silica include, for example, SFP-120MC and SFP-130MC manufactured by Denka Company Limited; and SC1050-MLQ, SC2050-MNU, SC2050-MTX, SE2053-SQ, YA050C-MJF and YA050C-MJA manufactured by Admatechs Company Limited.

Although the average particle diameter of the inorganic filler (D) is not limited, it is preferably 3 μm or less and more preferably 1 μm or less from the viewpoint of coping with narrower electrode pitch arranged on the chip and narrower gap between the electrodes when the resin composition of the present invention is used as an underfill material, preferably as a pre-applied underfill material. The lower limit value of the average particle diameter is not particularly limited, but it may be, for example, 10 nm. Note that the "average particle diameter" of the inorganic filler (D) as used herein means the median diameter of the inorganic filler (D). Here, the median diameter means a certain particle diameter such that, when the particle size distribution of powder is divided into two parts based on that particle diameter, the volume of particles on the side of larger particle diameter and the volume of particles on the side of smaller particle diameter each account for 50% of the entire powder. The average particle diameter (median diameter) of the inorganic filler (D) is measured according to the wet laser diffraction scattering method.

When the inorganic filler (D) is used, its content in the resin composition is preferably 300 parts by mass or less and more preferably 200 parts by mass or less based on 100 parts by mass of the total amount of the radical polymerizable compound (C) in the resin composition from the viewpoint of ensuring the flowability of an underfill material, preferably a pre-applied underfill material, in the joint process while improving the burning resistance and reducing the thermal expansion coefficient of the resin composition. In addition, the content of the inorganic filler (D) is preferably 10 parts by mass or more, more preferably 20 parts by mass or more, and still more preferably 50 parts by mass or more based on 100 parts by mass of the total amount of the radical polymerizable compound (C) in the resin composition. Note that, when two or more kinds of inorganic fillers (D) are used in combination, it is preferable that their total amount should satisfy the content range described above.

[I-5. Flexibility Imparting Component (E)]

Although the flexibility imparting component (E) in the resin composition of the present embodiment is not particularly limited as long as it is a component that can impart flexibility to a layer containing the resin composition, examples thereof include, for example, a thermoplastic polymer compound such as a polyimide, a polyamide imide, a polystyrene, a polyolefin, a styrene-butadiene rubber (SBR), an isoprene rubber (IR), a butadiene rubber (BR), an acrylonitrile-butadiene rubber (NBR), a polyurethane, a polypropylene, a (meth)acrylic oligomer, a (meth)acrylic polymer and a silicone resin. These flexibility imparting components (E) can be used alone as one kind or can be used in combination of two or more kinds.

Among the above, as the flexibility imparting component (E), at least one selected from the group consisting of a (meth)acrylic oligomer and a (meth)acrylic polymer is preferable from the viewpoint of solubility in an organic solvent that is used upon producing the resin composition, compatibility with the maleimide compound, controllability of the melt viscosity of the resin composition, and impartment of flexibility. Examples of the (meth)acrylic oligomer and the (meth)acrylic polymer include, for example, the "ARUFON (registered trademark)" series from Toagosei Co., Ltd.; the "ACTFLOW (registered trademark)" series from Soken Chemical & Engineering Co., Ltd.; the "PARACRON (registered trademark)" series from Negami Chemical Industrial Co., Ltd.; and the "KURARITY (registered trademark)" series from KURARAY CO., LTD.

Although the molecular weight of the flexibility imparting component (E) is not limited, the mass average molecular weight is preferably 1,000 or more from the viewpoint of imparting flexibility to the resin composition, and is more preferably 2,000 or more from the viewpoint of imparting resilience and good tenacity in the cured product. In addition, when the resin composition is used as an underfill material, suitably as a pre-applied underfill material, in order to obtain a joint with a better and more stable shape without entrapment of the resin composition into the metal joint, it is preferable to control the melt viscosity of the resin composition at a low level and to ensure the flowability of the resin composition upon the joint process. From such a viewpoint, the mass average molecular weight of the flexibility imparting component (E) is preferably 1,000,000 or less, more preferably 800,000 or less, still more preferably 100,000 or less, and from the viewpoint of solvent solubility, even more preferably 10,000 or less. By using a flexibility imparting component (E) having a mass average molecular weight in such a preferable range, both flexibility of the resin composition and joinability in the case of being used as an underfill material, suitably as a pre-applied underfill material can be achieved in a more well balanced manner.

When the flexibility imparting component (E) is used, its content in the resin composition is preferably 100 parts by mass or less, more preferably 50 parts by mass or less, and still more preferably 30 parts by mass or less based on 100 parts by mass of the total amount of the above radical polymerizable compound (C) in the resin composition from the viewpoint of controllability of melt viscosity. In addition, the content of the flexibility imparting component (E) in the resin composition is preferably 1 part by mass or more and more preferably 5 parts by mass or more based on 100 parts by mass of the total amount of the above radical polymerizable compound (C) in the resin composition from the viewpoint of achieving action effects caused by the use of the flexibility imparting component (E) more effectively and reliably. Note that, when two or more kinds of flexibility imparting components (E) are used in combination, it is preferable that their total amount should be within the content range described above.

[I-6. Additional Component]

The resin composition of the present embodiment contains the compound (A) having the phenolic hydroxy group, the metal ion trapping agent (B) and the radical polymerizable compound (C), and if required, may further contain the inorganic filler (D), the flexibility imparting component (E) and one kind of or two or more kinds of additional components.

For example, the resin composition of the present embodiment may contain a silane coupling agent for the purpose of improving moisture absorption heat resistance and improving the adhesiveness between the chip and the resin composition. The silane coupling agent is not limited as long as it is a silane coupling agent that is generally used for surface treatment of inorganic matter and that has low reactivity with the compound (A) having the phenolic hydroxy group. Specific examples thereof include a vinylsilane-based silane coupling agent (for example, vinyltrimethoxysilane and γ-(meth)acryloxypropyltrimethoxysilane), a phenylaminosilane-based silane coupling agent (for example, N-phenyl-3-aminopropyltrimethoxysilane), a phenylsilane-based silane coupling agent, and an imidazolesilane-based silane coupling agent. These silane coupling agents can be used alone as one kind or can be used in combination of two or more kinds.

When the silane coupling agent is used, its content in the resin composition is not limited. However, its content is preferably 0.05 parts by mass or more and 20 parts by mass or less and more preferably 0.1 parts by mass or more and 15 parts by mass or less based on 100 parts by mass of the total amount of the above radical polymerizable compound (C) in the resin composition from the viewpoint of improving moisture absorption heat resistance and reducing volatilization volume upon the flip chip bonding. Note that, when two or more kinds of silane coupling agents are used in combination, it is preferable that their total amount should be within the content range described above.

The resin composition of the present embodiment may contain a wetting and dispersing agent for the purpose of, for example, improving the producibility of a laminate and improving the dispersibility of the inorganic filler (D). The wetting and dispersing agent is not limited as long as it is a wetting and dispersing agent that is used in general for a paint and the like. Examples thereof include, for example, Disperbyk-110, 111, 180 and 161, and BYK-W996, W9010 and W903 (hereinbefore, product names) manufactured by BYK Japan KK. These wetting and dispersing agents can be used alone as one kind or can be used in combination of two or more kinds.

When the wetting and dispersing agent is used, its content in the resin composition is not limited, but it is preferably 0.1 parts by mass or more and 5 parts by mass or less and more preferably 0.5 parts by mass or more and 3 parts by mass or less based on 100 parts by mass of the inorganic filler (D) from the viewpoint of improving the producibility of a laminate.

When the wetting and dispersing agent is used, its content in the resin composition is not limited, but it is preferably 0.1 parts by mass or more and 5 parts by mass or less and more preferably 0.5 parts by mass or more and 3 parts by mass or less based on 100 parts by mass of the total amount of the above radical polymerizable compound (C) in the resin composition from the viewpoint of improving the producibility of a laminate.

Note that, when two or more kinds of wetting and dispersing agents are used in combination, it is preferable that their total amount should be within the content range described above.

The resin composition of the present embodiment may contain a curing accelerator for the purpose of adjusting the cure rate, and the like. The curing accelerator is not particularly limited as long as it is publicly known as a curing accelerator for a maleimide compound and is generally used. Specific examples of the curing accelerator include an imidazole and a derivative thereof (for example, 2-ethyl-4-methylimidazole, 2-phenyl-4-methylimidazole, 1-benzyl-2-phenylimidazole and 2,4,5-triphenylimidazole); a tertiary amine (for example, triethylamine and tributylamine); and a variety of organic peroxides as a thermal radical polymerization initiator (for example, dicumyl peroxide, di(2-tert-butylperoxyisopropyl)benzene, p-menthane hydroperoxide, diisopropylbenzene hydroperoxide and cumene hydroperoxide). These curing accelerators can be used alone as one kind or can be used in combination of two or more kinds.

When the curing accelerator is used, its content in the resin composition is not particularly limited, but it is preferably 0.001 parts by mass or more and 3 parts by mass or less, more preferably 0.005 parts by mass or more and 2 parts by mass or less, and still more preferably 0.01 parts by mass or more and 1 part by mass or less based on 100 parts by mass of the total amount of the above radical polymerizable compound (C) in the resin composition from the viewpoint of adjusting the cure rate. Note that, when two or more kinds of curing accelerators are used in combination, it is preferable that their total amount should be within the content range described above.

The resin composition of the present embodiment may contain a variety of additives for various purposes in a range in which the expected characteristics are not impaired. Examples of the additive include, for example, an ultraviolet absorbing agent, an antioxidant, a photopolymerization initiator, a fluorescent brightening agent, a photosensitizer, a dye, a pigment, a thickening agent, a lubricant, a defoaming agent, a leveling agent, a brightening agent and a flame retardant. These additives can be used alone as one kind or can be used in combination of two or more kinds. In the resin composition of the present embodiment, the contents of the additional additives are not particularly limited, but they each are normally 0.1 parts by mass or more and 10 parts by mass or less based on 100 parts by mass of the total amount of the above radical polymerizable compound (C) in the resin composition.

The resin composition of the present embodiment is prepared from the compound (A) having the phenolic hydroxy group, the metal ion trapping agent (B) and the radical polymerizable compound (C), and if required, it is prepared by further mixing in the inorganic filler (D), the flexibility imparting component (E) and an additional component. If required, the resin composition may be in the form of a varnish formed by dissolving or dispersing these components in an organic solvent. The varnish of the resin composition of the present embodiment can be suitably used as a varnish upon fabricating a laminate of the present embodiment, which will be described below. The organic solvent is not limited as long as it can suitably dissolve or disperse each of the components described above and does not impair the expected characteristics of the resin composition of the present embodiment. Examples of the organic solvent include, for example, an alcohol such as methanol, ethanol and propanol; a ketone such as acetone, methyl ethyl ketone (hereinafter, may be abbreviated as "MEK") and methyl isobutyl ketone; an amide such as dimethylacetamide and dimethylformamide; and an aromatic hydrocarbon such as toluene and xylene. These organic solvents can be used alone as one kind or can be used in combination of two or more kinds.

The resin composition of the present embodiment is excellent in flux activity, flexibility and storage stability. In addition, by coating a supporting material with the resin composition, a laminate having a resin layer that is excellent in flux activity can be provided. When the resin composition of the present embodiment is used as a pre-applied underfill material for use in the form of a laminate, it is not only excellent in flux activity, flexibility and storage stability, but also excellent in joinability, moisture absorption heat resistance, adhesiveness to the chip and the like, which can also demonstrate other suitable effects. As described above, the resin composition of the present embodiment has a variety of excellent features, and in particular, it can achieve flux activity, flexibility and storage stability at a high level. Therefore, the resin composition of the present embodiment is extremely useful as an underfill material, in particular as a pre-applied underfill material.

For the resin composition of the present embodiment, when a compound having a phenolic hydroxy group and a metal ion trapping agent are used in combination in a wet spreading test for a solder ball, which is an indication upon evaluating flux activity according to the method described in Examples below, it is preferable to combine those with a contact angle of the solder ball melted and wetly spread on the copper foil of less than 1.60 radians from the viewpoint of sufficiently removing the oxidized layer between the wires upon the bonding. For example, a compound having a phenolic hydroxy group and a metal ion trapping agent were scattered on the glossy surface of an electrolytic copper foil. A solder ball was placed thereon, and by heating on a hot plate, the solder was melted on the copper foil, and then cooled at room temperature. The flux activity was evaluated by measuring the contact angle of the solder ball wetly spread on the copper foil. For the contact angle of the solder ball, the radius (a) of the solder ball melted and wetly spread on the copper foil and the height (b) of the solder ball were determined, and the contact angle of the solder ball was calculated according to the following expression.

$$\text{contact angle of solder ball} = 2 \arctan\{(b)/(a)\}$$

[II. Laminate, Semiconductor Wafer with Resin Composition Layer Fabricated by Using Laminate, Substrate for Mounting Semiconductor with Resin Composition Layer Fabricated by Using Laminate, and Semiconductor Device]

The laminate, semiconductor wafer with a resin composition layer, substrate for mounting a semiconductor with a resin composition layer and semiconductor device of the present embodiment are all formed by using the above resin composition of the present embodiment.

[II-1. Laminate]

The laminate of the present embodiment contains a supporting material and a layer containing the resin composition of the present embodiment laminated on the supporting material. In such a laminate, the above resin composition of the present embodiment is attached to a supporting material. As the supporting material, there is no particular limitation, but a polymer film can be used. Examples of the material of the polymer film include, for example, a film containing at least one or more resins selected from the group consisting of a polyvinyl chloride, a polyvinylidene chloride, a polybutene, a polybutadiene, a polyurethane, an ethylene-vinyl acetate copolymer, a polyester such as a polyethylene terephthalate, a polyethylene naphthalate and a polybutylene terephthalate, a polyethylene, a polypropylene, an ethylene-propylene copolymer, a polymethylpentene, a polyimide and a polyamide; and a mold releasing film formed by coating the surface of these films with a mold releasing agent. Among the above, in particular, a polyester, a polyimide and a polyamide are preferable, and even among them, a polyethylene terephthalate, which is one kind of polyester, is more preferable.

Although the thickness of the supporting material of the present embodiment is not limited, it is preferably 10 μm or more and 100 μm or less from the viewpoint of producibility of the laminate, for example, stability of the coating thickness in the case of coating the supporting material with the resin composition. In addition, also from the viewpoint of conveyance properties of the resin laminate, the thickness of the supporting material is preferably 10 μm or more and 100 μm or less. The lower limit of the thickness is more preferably 12 μm or more, still more preferably 25 μm or more, and even more preferably 30 μm or more from the viewpoint of ensuring the yield upon producing the laminate. In addition, the upper limit of the thickness is more preferably 80 μm or less from the viewpoint of production costs of the laminate because the supporting material is peeled in the middle of the process and is not present in the end as a constituent member of the semiconductor device.

The method for producing the laminate of the present embodiment by forming a layer containing the resin composition of the present embodiment (hereinafter, also simply referred to as a "resin composition layer") on the supporting material described above is not limited. Examples of such a production method include an approach in which the surface of the supporting material described above is coated with a varnish formed by dissolving or dispersing the resin composition of the present embodiment in an organic solvent, and dried under heating and/or reduced pressure, and the solvent is removed to solidify the resin composition of the present embodiment, thereby forming the resin composition layer. The drying conditions are not particularly limited, but the drying is carried out such that the content ratio of the organic solvent to the resin composition layer is usually 10% by mass or less, and preferably 5% by mass or less based on the total amount of the resin composition layer (100% by mass). Conditions for achieving such drying vary depending on the type of the organic solvent in the varnish and the amount to be compounded. For example, for a resin composition containing the compound (A) having the phenolic hydroxy group, the metal ion trapping agent (B) and the radical polymerizable compound (C), if a varnish contains MEK at 30 parts by mass or more and 60 parts by mass or less based on 100 parts by mass of the total amount of the above components, the varnish is generally dried under heating conditions of 90° C. or higher and 160° C. or lower at 1 atm for approximately 1 minute or longer and 10 minutes or shorter. Although the thickness of the resin composition layer in the laminate of the present embodiment is not limited, it is preferably in the range of 5 µm or more and 500 µm or less and more preferably in the range of 10 µm or more and 100 µm or less from the viewpoint of removing light volatile portions in a better manner upon drying the resin composition layer and from the viewpoint of achieving functions as the laminate more effectively and reliably.

[II-2. Semiconductor Wafer with Resin Composition Layer Fabricated by Using Laminate and Substrate for Mounting Semiconductor with Resin Composition Layer Fabricated by Using Resin Laminate]

The semiconductor wafer with a resin composition layer of the present embodiment contains a semiconductor wafer and a resin composition layer in the laminate described above, which is laminated on the semiconductor wafer, and it is formed of the above laminate of the present embodiment and the semiconductor wafer. The substrate for mounting a semiconductor with a resin composition layer of the present embodiment contains a substrate for mounting a semiconductor and a resin composition layer in the laminate described above, which is laminated on the substrate, and it is formed of the above laminate of the present embodiment and the substrate.

The method for fabricating the semiconductor wafer with a resin composition layer of the present embodiment is not limited, but for example, it is obtained by pasting the semiconductor wafer and the resin composition layer together such that the resin composition layer of the laminate of the present embodiment and the surface of the semiconductor wafer on which the electrodes have been formed, that is, the surface on which the joint with the substrate will take place, face each other. In addition, the method for fabricating the substrate with a resin composition layer of the present embodiment is not limited, but for example, it is obtained by pasting the substrate and the resin composition layer together such that the resin composition layer of the laminate of the present embodiment and the surface of the substrate on which chips are mounted face each other.

Although the method for pasting the laminate of the present embodiment and the semiconductor wafer or substrate together is not particularly limited, a vacuum pressing laminator can be suitably used. In this case, a method is preferable in which pressure is applied to the laminate of the present embodiment via an elastic body such as rubber, thereby pasting the laminate and the semiconductor wafer or substrate together. The lamination conditions are not particularly limited as long as they are conditions generally used in the art, and for example, the lamination is performed at a temperature of 50° C. or higher and 140° C. or lower, with a contact pressure in the range of 1 kgf/cm$^2$ to 11 kgf/cm$^2$, and under an atmospheric reduced pressure of 20 hPa or less. Subsequently to the lamination step, smoothing of the pasted laminate may be performed through hot pressing with metal plates. The above lamination step and the smoothing step can be performed sequentially with a commercially available vacuum pressing laminator. In the laminate stuck to the semiconductor wafer or substrate, removal of the supporting material is performed before the flip chip bonding in any case.

[II-3. Semiconductor Device]

The semiconductor device of the present embodiment contains, for example, the semiconductor wafer with a resin composition layer of the present embodiment and/or the substrate with a resin composition layer of the present embodiment, and is constituted with the resin composition layer of the present embodiment, a chip and a substrate. Although the method for producing the semiconductor device of the present embodiment is not limited, and examples thereof include, for example, an approach in which the semiconductor wafer with a resin composition layer of the present embodiment is thinned with a grinding means and is divided into individual pieces with a dicing saw to make a chip with the resin composition layer, which are then mounted on the substrate. In addition, a chip may be mounted on the substrate with a resin composition layer of the present embodiment. In the method for mounting the chip with the resin composition layer on the substrate and the method for mounting a semiconductor chip on the substrate with the resin composition layer, a flip chip bonder compatible with the thermocompression bonding method can be suitably used. In addition, although the case in which the chip is mounted on the substrate in the form of flip chip bonding is described for convenience in the present embodiment, the object to which the resin composition of the present embodiment is applied while mounting the chip in the form of flip chip bonding does not need to be a substrate. For example, the resin composition of the present embodiment may be used for a joint between a semiconductor wafer and a chip upon mounting the chip on the semiconductor wafer or for a joint between chips of a chip laminate in which inter-chip connection is formed via TSV (Through Silicon Via), and in any case, the superiority according to the present invention can be obtained.

EXAMPLES

Hereinafter, the present invention will be described in detail with reference to Examples and Comparative Examples, but the present invention is not limited to these Examples in any way.

[1. Measurement Method and Evaluation of Flux Activity]

(1) Mass Average Molecular Weight (Mw)

Using LC-20AD (product name, manufactured by Shimadzu Corporation), the mass average molecular weight (Mw) was measured as the molecular weight in terms of the standard polystyrene by the gel permeation chromatograph (GPC) method.

(2) 5% Mass Reduction Temperature

About 10 mg of a compound having a phenolic hydroxy group was weighed, and the temperature was elevated from room temperature to 500° C. under conditions with a temperature elevation rate of 10° C./min using TG/DTA6200 (product name, manufactured by Seiko Instruments Inc.). In the obtained mass reduction curve, the temperature at which the mass is decreased by 5% was defined as the 5% mass reduction temperature.

(3) Evaluation of Flux Activity of Compound Having Phenolic Hydroxy Group and Metal Ion Trapping Agent The flux activity of a compound having a phenolic hydroxy group alone, a metal ion trapping agent alone, and a combination of a compound having a phenolic hydroxy group and a metal ion trapping agent were evaluated.

<Compound Having Phenolic Hydroxy Group>
(I) PHENOLITE (registered trademark) KA-1163 (product name, cresol novolac-based phenolic resin, manufactured by DIC CORPORATION)
(II) TBIS (registered trademark)-MP (product name, biscresolfluorene, manufactured by Taoka Chemical Co., Ltd.)
(III) SN-495V (product name, naphthol aralkyl-based phenolic resin, manufactured by the new Nippon Steel Chemical Co., Ltd.)
(IV) BPN01 (product name, propenyl biphenylene resin, manufactured by Gunei Chemical Industry Co., Ltd.)
(V) ELPC75 (product name, phenolic resin, manufactured by Gunei Chemical Industry Co., Ltd.)
(VI) 4,4'-methylenebis(2,6-di-tert-butylphenol) (manufactured by Tokyo Kasei Kogyo Co., Ltd.)

<Metal Ion Trapping Agent>
(i) 1-(4-tert-butylphenyl)-3-(4-methoxyphenyl)-1,3-propanedione (manufactured by Tokyo Kasei Kogyo Co., Ltd.)
(ii) (E,E)-1,7-bis(4-hydroxy-3-methoxyphenyl)-1,6-heptadiene-3,5-dione (manufactured by Tokyo Kasei Kogyo Co., Ltd.)
(iii) 2,4-diamino-6-methyl-1,3,5-triazine (manufactured by Tokyo Kasei Kogyo Co., Ltd.)
(iv) 2,2'-bipyridine (manufactured by Tokyo Kasei Kogyo Co., Ltd.)

(3-1) Evaluation of Flux Activity of (I) to (VI) Alone

Compounds (I) to (VI) having a phenolic hydroxy group were scattered on the glossy surface of an electrolytic copper foil with a thickness of 12 μm (3EC-III, product name, manufactured by MITSUI MINING & SMELTING CO., LTD.), and a solder ball with a diameter of 0.5 mm (ECO SOLDER (registered trademark) ball M705 (product name), SN-3.0 Ag-0.5 Cu alloy, manufactured by Senju Metal Industry Co., Ltd.) was placed thereon. This was heated on a hot plate kept at 235° C. for 1 minute to melt the solder on the copper foil, and the solder was then cooled at room temperature. The flux activity was evaluated by measuring the contact angle of the solder ball wetly spread on the copper foil. For the contact angle of the solder ball, the radius (a) of the solder ball melted and wetly spread on the copper foil and the height (b) of the solder ball were determined by using a digital microscope (KH-7700 (product name), manufactured by HIROX CO., LTD.), and the contact angle was calculated according to the following expression.

$$\text{contact angle of solder ball} = 2 \arctan\{(b)/(a)\}$$

The compound with a contact angle of the solder ball of less than 1.60 radians was described as A, the compound with a contact angle of 1.60 radians or more and less than 2.00 radians was described as B, and the compound with a contact angle of 2.00 radians or more was described as C.

TABLE 1

|  | (I) | (II) | (III) | (IV) | (V) | (VI) |
| --- | --- | --- | --- | --- | --- | --- |
| Contact angle | C (2.33 rad) | C (2.46 rad) | C (2.31 rad) | C (2.27 rad) | C (2.45 rad) | C (2.50 rad) |

(3-2) Evaluation of Flux Activity of (i) to (iv) Alone

Metal ion trapping agents (i) to (iv) were scattered on the glossy surface of an electrolytic copper foil with a thickness of 12 μm (3EC-III, product name, manufactured by MITSUI MINING & SMELTING CO., LTD.), and a solder ball with a diameter of 0.5 mm (ECO SOLDER (registered trademark) ball M705 (product name), SN-3.0 Ag-0.5 Cu alloy, manufactured by Senju Metal Industry Co., Ltd.) was placed thereon. This was heated on a hot plate kept at 235° C. for 1 minute to melt the solder on the copper foil and the solder was then cooled at room temperature. By measuring the contact angle of the solder ball wetly spread on the copper foil, the flux activity was evaluated. For the contact angle of the solder ball, the radius (a) of the solder ball melted and wetly spread on the copper foil and the height (b) of the solder ball were determined by using a digital microscope (KH-7700 (product name), manufactured by HIROX CO., LTD.) and the contact angle was calculated according to the following expression.

$$\text{contact angle of solder ball} = 2 \arctan\{(b)/(a)\}$$

The metal ion trapping agent with a contact angle of the solder ball of less than 1.60 radians was described as A, the metal ion trapping agent with a contact angle of 1.60 radians or more and less than 2.00 radians was described as B, and the metal ion trapping agent with a contact angle of 2.00 radians or more was described as C.

TABLE 2

|  | (i) | (ii) | (iii) | (iv) |
| --- | --- | --- | --- | --- |
| Contact angle | C (2.40 rad) | C (2.34 rad) | C (2.47 rad) | C (2.42 rad) |

(3-3) Evaluation of Flux Activity Upon Using Compound Having Phenolic Hydroxy Group and Metal Ion Trapping Agent in Combination Compounds (I) to (VI) having a phenolic hydroxy group and metal ion trapping agents (i) to (iv) were scattered on the glossy surface of an electrolytic copper foil with a thickness of 12 µm (3EC-III, product name, manufactured by MITSUI MINING & SMELTING CO., LTD.), and a solder ball with a diameter of 0.5 mm (ECO SOLDER (registered trademark) ball M705 (product name), SN-3.0 Ag-0.5 Cu alloy, manufactured by Senju Metal Industry Co., Ltd.) was placed thereon. This was heated on a hot plate kept at 235° C. for 1 minute to melt the solder on the copper foil, and then the solder was cooled at room temperature. The contact angle of the solder ball wetly spread on the copper foil was measured, thereby evaluating the flux activity. For the contact angle of the solder ball, the radius (a) of the solder ball melted and wetly spread on the copper foil and the height (b) of the solder ball were determined by using a digital microscope (KH-7700 (product name), manufactured by HIROX CO., LTD.) and the contact angle was calculated according to the following expression.

contact angle of solder ball=2 arctan{(b)/(a)}

The combination with a contact angle of the solder ball of less than 1.60 radians was described as AA, the combination with a contact angle of 1.60 radians or more and less than 2.00 radians was described as A, and the combination with a contact angle of 2.00 radians or more was described as C.

TABLE 3

| | | (I) | (II) | (III) | (IV) | (V) | (VI) |
|---|---|---|---|---|---|---|---|
| Contact angle | (i) | AA (0.87 rad) | AA (0.98 rad) | AA (1.40 rad) | AA (1.07 rad) | AA (0.98 rad) | C (2.01 rad) |
| | (ii) | AA (0.90 rad) | AA (1.10 rad) | AA (1.56 rad) | AA (1.12 rad) | AA (1.04 rad) | C (2.23 rad) |
| | (iii) | AA (0.98 rad) | AA (0.91 rad) | AA (1.46 rad) | AA (1.12 rad) | AA (1.07 rad) | C (2.11 rad) |
| | (iv) | AA (1.52 rad) | AA (1.44 rad) | A (1.90 rad) | A (1.61 rad) | AA (1.55 rad) | C (2.22 rad) |

From Tables 1 to 3, for each of the compounds (I) to (VI) having a phenolic hydroxy group and the metal ion trapping agents (i) to (iv) alone, the solder ball was not wetly spread, that is, good flux activity was not confirmed. However, it was revealed that, when the compounds (I) to (V) having a phenolic hydroxy group and the metal ion trapping agents (i) to (iv) were used in combination, good flux activity is exhibited.

[2. Fabrication of Resin Compositions and Resin Laminates]

Example 1

60 parts by mass (30 parts by mass in terms of non-volatile portions) of a solution of PHENOLITE (registered trademark) KA-1163 (product name, mass average molecular weight (Mw): 4600, softening point: 105 to 115° C., 5% mass reduction temperature: 298° C., cresol novolac-based phenolic resin, manufactured by DIC CORPORATION) as the compound (A) having a phenolic hydroxy group in MEK (non-volatile portions 50% by mass); 30 parts by mass of 1-(4-tert-butylphenyl)-3-(4-methoxyphenyl)-1,3-propanedione (manufactured by Tokyo Kasei Kogyo Co., Ltd.) as the metal ion trapping agent (B); 40 parts by mass (20 parts by mass in terms of non-volatile portions) of a solution of a maleimide compound wherein all $R^1$ in the above formula (1) is a hydrogen atom and $n^1$ is 1 to 3 (BMI-2300, manufactured by Daiwa kasei Industry Co., LTD.) as the radical polymerizable compound (C) in MEK (non-volatile portions 50% by mass); 40 parts by mass (20 parts by mass in terms of non-volatile portions) of a solution of a maleimide compound represented by the above formula (2) wherein $n^2$ is 14 (average value) (BMI-1000P, manufactured by K•I Chemical Industry Co., LTD.) as the second radical polymerizable compound (C) in MEK (non-volatile portions 50% by mass); 60 parts by mass (30 parts by mass in terms of non-volatile portions) of a solution of bis-(3-ethyl-5-methyl-4-maleimidophenyl)methane (BMI-70, manufactured by K•I Chemical Industry Co., LTD.) as the third radical polymerizable compound (C) in MEK (non-volatile portions 50% by mass); 60 parts by mass (30 parts by mass in terms of non-volatile portions) of a solution of 2,2-bis(4-(4-maleimidophenoxy)phenyl)propane (BMI-80, manufactured by K•I Chemical Industry Co., LTD.) as the fourth radical polymerizable compound (C) in MEK (non-volatile portions 50% by mass); 166.7 parts by mass (100 parts by mass in terms of non-volatile portions) of a slurry silica (SC-1050MLQ, average particle diameter: 0.3 µm, non-volatile portions 60% by mass, manufactured by Admatechs Company Limited.) as the inorganic filler (D); 15 parts by mass of an acrylic polymer (mass average molecular weight (Mw): 2900, ARUFON (registered trademark) US-6170, manufactured by Toagosei Co., Ltd.) as the flexibility imparting component (E); and 0.5 parts by mass (0.1 parts by mass in terms of non-volatile portions) of a solution of 1-benzyl-2-methylimidazole (manufactured by Tokyo Kasei Kogyo Co., Ltd.) as the imidazole-based curing catalyst in MEK (non-volatile portions 20% by mass) were mixed and stirred for 30 minutes by using a high speed stirring apparatus, thereby obtaining a varnish. With this varnish, a polyethylene terephthalate film having a thickness of 38 µm (TR1-38, manufactured by UNITIKA LTD.), the surface of which was coated with a mold releasing agent, was coated, and it was heated and dried at 120° C. for 5 minutes, thereby obtaining a resin laminate with the resin composition layer of the present invention having a thickness of 30 µm.

Example 2

A varnish was prepared in the same manner as in Example 1 except that the compound (A) having the phenolic hydroxy group was changed to 60 parts by mass (30 parts by mass in terms of non-volatile portions) of a solution of IBIS (registered trademark)-MP (product name, 9,9'-bis-(4-hydroxy-3-methylphenyl)fluorene, molecular weight: 378, melting point: 225° C., 5% mass reduction temperature: 313° C., manufactured by Taoka Chemical Co., Ltd.) in MEK (non-volatile portions 50% by mass), thereby obtaining a resin laminate.

Example 3

A varnish was prepared in the same manner as in Example 1 except that the metal ion trapping agent (B) was changed to 30 parts by mass of (E,E')-1,7-bis(4-hydroxy-3-methoxyphenyl)-1,6-heptadiene-3,5-dione (manufactured by Tokyo Kasei Kogyo Co., Ltd.), thereby obtaining a resin laminate.

Example 4

A varnish was prepared in the same manner as in Example 1 except that the compound (A) having the phenolic hydroxy group was changed to 60 parts by mass (30 parts by mass in terms of non-volatile portions) of a solution of IBIS (registered trademark)-MP (product name, 9,9'-bis-(4-hydroxy-3-methylphenyl)fluorene, molecular weight: 378, manufactured by Taoka Chemical Co., Ltd.) in MEK (non-volatile portions 50% by mass) and the metal ion trapping agent (B) was changed to 30 parts by mass of (E,E)-1,7-bis(4-hydroxy-3-methoxyphenyl)-1,6-heptadiene-3,5-dione (manufactured by Tokyo Kasei Kogyo Co., Ltd.), thereby obtaining a resin laminate.

Example 5

A varnish was prepared in the same manner as in Example 1 except that the compound (A) having the phenolic hydroxy group was changed to 100 parts by mass (50 parts by mass in terms of non-volatile portions) of a solution of PHENOLITE (registered trademark) KA-1163 in MEK (non-volatile portions 50% by mass), thereby obtaining a resin laminate.

Example 6

A varnish was prepared in the same manner as in Example 1 except that the metal ion trapping agent (B) was changed to 50 parts by mass of 1-(4-tert-butylphenyl)-3-(4-methoxyphenyl)-1,3-propanedione, thereby obtaining a resin laminate.

Example 7

A varnish was prepared in the same manner as in Example 1 except that the metal ion trapping agent (B) was changed to 30 parts by mass of 2,4-diamino-6-methyl-1,3,5-triazine (manufactured by Tokyo Kasei Kogyo Co., Ltd.), thereby obtaining a resin laminate.

Example 8

A varnish was prepared in the same manner as in Example 1 except that the metal ion trapping agent (B) was changed to 30 parts by mass of 2,2'-bipyridine (manufactured by Tokyo Kasei Kogyo Co., Ltd.), thereby obtaining a resin laminate.

Comparative Example 1

A varnish was prepared in the same manner as in Example 1 except that the compound (A) having the phenolic hydroxy group was not used, thereby obtaining a resin laminate.

Comparative Example 2

A varnish was prepared in the same manner as in Example 1 except that the metal ion trapping agent (B) was not used, thereby obtaining a resin laminate.

Comparative Example 3

A varnish was prepared in the same manner as in Example 1 except that neither compound (A) having the phenolic hydroxy group nor metal ion trapping agent (B) was used, thereby obtaining a resin laminate.

[2. Evaluation of Resin Laminates and Varnishes]

(1) Bonding Test

The resin laminates obtained in Examples 1 to 8 and Comparative Examples 1 to 3 were cut into 8 mm×8 mm squares and laminated on a substrate for evaluation, and then by using a flip chip bonder (LFB-2301 (product name), manufactured by SHINKAWA LTD.), a semiconductor chip having a Cu pillar constituted with copper and solder as an electrode were pressure bonded thereto under conditions with a stage temperature of 70° C., a bond head temperature of 300° C., a load of 50 N and a time of 8 seconds, thereby performing a bonding test. Through observation for the cross section of the bonding test sample, when flux activity is developed at the contact portion between the solder on the Cu pillar on the side of the semiconductor chip and the copper wiring on the side of the substrate and alloy production is confirmed, it was described as AA, and when flux activity is not developed and alloy production is not confirmed, it was described as C.

(2) Flexibility

The resin laminates obtained in Examples 1 to 8 and Comparative Examples 1 to 3 were cut into strips of 5 cm×10 cm, and they were wound around a metal tube with an outer diameter of 3 cm at room temperature such that the polyethylene terephthalate film, which is the supporting material, was placed inside; retained for 5 seconds; and then unwound. After repeating this operation 10 times, the presence or absence of cracks in the resin composition layer was visually confirmed, thereby performing evaluation of flexibility. When occurrence of cracks is not found at all, it was described as AA; when occurrence of a slight amount of cracks is found but at a level that would not affect the quality in actual use, it was described as A; and when cracks occur at a level that is not allowed for actual use, it was described as C.

(3) Storage Stability

The viscosity (c) of the varnishes obtained in Examples 1 to 8 and Comparative Examples 1 to 3 was measured using a B type viscometer (manufactured by TOKYO KEIKI INC.), and after leaving the varnishes in a closed container at room temperature for two weeks, the viscosity (d) was measured again using the B type viscometer. The rate of change in viscosity after two weeks had passed was calculated according to the following expression. When the rate of change is less than 20%, it was described as AA; when the rate of change in viscosity after two weeks have passed is 20% or more and less than 40%, it was described as A; and when the rate of change in viscosity after two weeks have passed is 40% or more, it was described as C.

rate of change in viscosity=$\{|(d)-(c)|/(c)\}\times 100$

TABLE 4

| | Ex. 1 | Ex. 2 | Ex. 3 | Ex. 4 | Ex. 5 | Ex. 6 | Ex. 7 | Ex. 8 | Comp. Ex. 1 | Comp. Ex. 2 | Comp. Ex. 3 |
|---|---|---|---|---|---|---|---|---|---|---|---|
| Bonding test | AA | AA | AA | AA | AA | AA | AA | AA | C | C | C |
| Flexibility | AA | AA | AA | AA | A | A | AA | AA | AA | AA | AA |
| Storage stability | AA | AA | AA | AA | AA | AA | A | A | AA | AA | AA |

From Table 4, Examples 1 to 8 using the resin composition of the present embodiment exhibited better results in the bonding test compared to Comparative Examples 1 to 3. In addition, although there is no practical problem for the resin compositions described in Examples 5 and 6, the results of Examples 5 and 6 showed that it is necessary to optimize the amounts of the compound having the phenolic hydroxy group and the metal ion trapping agent to be compounded in order to obtain a resin composition in which more excellent flux activity and flexibility are both achieved in the present embodiment.

In addition, although there is no practical problem for the resin compositions described in Examples 7 and 8, it was also shown that there is concern about storage stability because the metal ion trapping agents (B) used in Examples 7 and 8 exhibit reactivity with maleimide compounds compounded as radical polymerizable compounds (C). On the other hand, it was also shown that, when a diketone derivative was compounded as the metal ion trapping agent (B), it does not exhibit reactivity with maleimide compounds compounded as the radical polymerizable compounds (C) and good storage stability is obtained.

The present application is based on Japanese Patent Application No. 2018-85651 filed on Apr. 26, 2018, the contents of which are incorporated herein by reference.

INDUSTRIAL APPLICABILITY

As described above, the resin composition of the present invention is excellent in flux activity, flexibility and storage stability, and exhibits a variety of effects. Therefore, it is useful as a resin composition, in particular, as a pre-applied underfill material. The resin composition of the present invention is excellent in flux activity and a good joint state can thus be obtained upon performing the joint between a semiconductor chip and a substrate, the joint between a semiconductor chip and a semiconductor wafer, and even the joint between a semiconductor chip and a semiconductor chip. Therefore, it is extremely useful.

The invention claimed is:

1. A resin composition comprising:
   a compound (A) having a phenolic hydroxy group;
   a metal ion trapping agent (B); and
   a radical polymerizable compound (C);
   wherein the compound (A) having the phenolic hydroxy group has a 5% mass reduction temperature of 250° C. or higher.

2. The resin composition according to claim 1, wherein the compound (A) having the phenolic hydroxy group has a molecular weight of 200 or more and a melting point of 300° C. or lower.

3. The resin composition according to claim 1, wherein the metal ion trapping agent (B) comprises at least one element selected from nitrogen and oxygen as a coordinating atom.

4. The resin composition according to claim 1, wherein the metal ion trapping agent (B) comprises at least one selected from the group consisting of an amine, an amine derivative, an ether derivative and a ketone derivative.

5. The resin composition according to claim 1, wherein the metal ion trapping agent (B) comprises at least one selected from the group consisting of a triazine derivative, a bipyridine derivative and a diketone derivative.

6. The resin composition according to claim 1, wherein the metal ion trapping agent (B) comprises a 1,3-diketone.

7. The resin composition according to claim 1, wherein the metal ion trapping agent (B) comprises at least one selected from the group consisting of 2,4-diamino-6-methyl-1,3,5-triazine, 2,2'-bipyridine, 1,3-diphenyl-1,3-propanedione, 1-(2-mesitylene)-1,3-butanedione, 1,3-bis(4-methoxyphenyl)-1,3-propanedione, 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione.

8. The resin composition according to claim 1, wherein the metal ion trapping agent (B) comprises at least one selected from the group consisting of 1-(4-tert-butylphenyl)-3-(4-methoxyphenyl)-1,3-propanedione and (E,E)-1,7-bis(4-hydroxy-3-methoxyphenyl)-1,6-heptadiene-3,5-dione.

9. The resin composition according to claim 1, wherein the radical polymerizable compound (C) comprises at least one selected from the group consisting of a (meth)acrylate compound, a maleimide compound and a propenyl compound.

10. The resin composition according to claim 9, wherein the radical polymerizable compound (C) comprises at least one selected from the group consisting of 2,2'-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2) and a maleimide compound represented by the following formula (3):

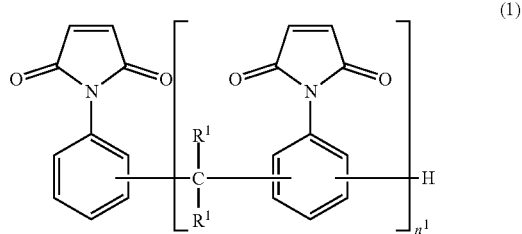

(1)

wherein each $R^1$ independently represents a hydrogen atom or a methyl group, and $n^1$ represents an integer of 1 or more;

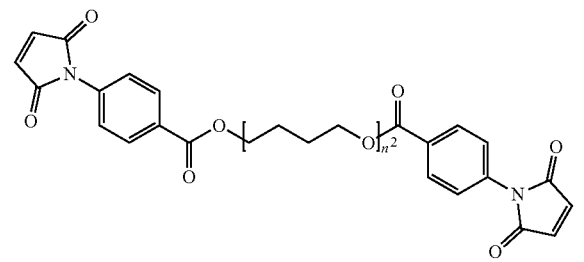

(2)

wherein an average value of $n^2$ is 1 or more and 30 or less; and

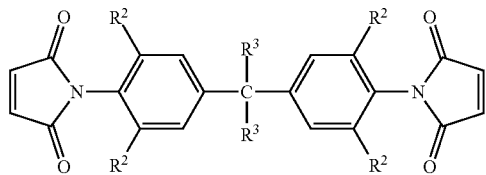

(3)

wherein each $R^2$ independently represents a hydrogen atom, a methyl group or an ethyl group, and each $R^3$ independently represents a hydrogen atom or a methyl group.

11. The resin composition according to claim 10, wherein the radical polymerizable compound (C) comprises at least one maleimide compound selected from the group consisting of 2,2'-bis(4-(4-maleimidophenoxy)phenyl)propane, the maleimide compound represented by the above formula (1), the maleimide compound represented by the above formula (2) and the maleimide compound represented by the above formula (3).

12. The resin composition according to claim 1, wherein a content of the compound (A) having the phenolic hydroxy group in the resin composition is 5 parts by mass or more and 50 parts by mass or less based on 100 parts by mass of a total amount of the radical polymerizable compound (C) in the resin composition.

13. The resin composition according to claim 1, wherein a content of the metal ion trapping agent (B) in the resin composition is 5 parts by mass or more and 50 parts by mass or less based on 100 parts by mass of a total amount of the radical polymerizable compound (C) in the resin composition.

14. The resin composition according to claim 1, further comprising an inorganic filler (D).

15. The resin composition according to claim 14, wherein the inorganic filler (D) has an electrical insulation property.

16. The resin composition according to claim 14, wherein the inorganic filler (D) has an average particle diameter of 3 μm or less.

17. The resin composition according to claim 14, wherein the inorganic filler (D) comprises at least one selected from the group consisting of silica, aluminum hydroxide, alumina, boehmite, boron nitride, aluminum nitride, magnesium oxide and magnesium hydroxide.

18. The resin composition according to claim 14, wherein a content of the inorganic filler (D) in the resin composition is 300 parts by mass or less based on 100 parts by mass of a total amount of the radical polymerizable compound (C).

19. The resin composition according to claim 1, further comprising a flexibility imparting component (E).

20. The resin composition according to claim 19, wherein the flexibility imparting component (E) comprises a thermoplastic polymer compound and the polymer compound has a mass average molecular weight of 1,000 or more and 1,000,000 or less.

21. The resin composition according to claim 19, wherein the flexibility imparting component (E) comprises at least one selected from the group consisting of a (meth)acrylic oligomer and a (meth)acrylic polymer.

22. The resin composition according to claim 1, for use in a pre-applied underfill material.

23. A laminate comprising:
a supporting material; and
a layer comprising the resin composition according to claim 1 laminated on the supporting material.

24. A semiconductor wafer with a resin composition layer, comprising:
a semiconductor wafer; and
the laminate according to claim 23 laminated on the semiconductor wafer,
wherein the layer comprising the resin composition is laminated on the semiconductor wafer.

25. A substrate for mounting a semiconductor with a resin composition layer, comprising:
a substrate for mounting a semiconductor; and
the laminate according to claim 23 laminated on the substrate for mounting a semi conductor,
wherein the layer comprising the resin composition is laminated on the substrate for mounting a semiconductor.

26. A semiconductor device, comprising the semiconductor wafer with a resin composition layer according to claim 24.

27. A semiconductor device, comprising the substrate for mounting a semiconductor with a resin composition layer according to claim 25.

* * * * *

UNITED STATES PATENT AND TRADEMARK OFFICE
CERTIFICATE OF CORRECTION

| | | |
|---|---|---|
| PATENT NO. | : 11,935,803 B2 | Page 1 of 1 |
| APPLICATION NO. | : 17/049456 | |
| DATED | : March 19, 2024 | |
| INVENTOR(S) | : Okaniwa et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 803 days.

Signed and Sealed this
Twenty-sixth Day of August, 2025

Coke Morgan Stewart
*Acting Director of the United States Patent and Trademark Office*